US011917805B2

(12) United States Patent
Lee et al.

(10) Patent No.: US 11,917,805 B2
(45) Date of Patent: Feb. 27, 2024

(54) SEMICONDUCTOR MEMORY DEVICE

(71) Applicant: Samsung Electronics Co., Ltd., Suwon-si (KR)

(72) Inventors: Kyunghwan Lee, Seoul (KR); Yongseok Kim, Suwon-si (KR); Ilgweon Kim, Busan (KR); Huijung Kim, Seongnam-si (KR); Sungwon Yoo, Hwaseong-si (KR); Minhee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 139 days.

(21) Appl. No.: 17/541,584

(22) Filed: Dec. 3, 2021

(65) Prior Publication Data
US 2022/0199621 A1 Jun. 23, 2022

(30) Foreign Application Priority Data
Dec. 22, 2020 (KR) .................. 10-2020-0181177

(51) Int. Cl.
*H10B 12/00* (2023.01)
(52) U.S. Cl.
CPC .................... *H10B 12/00* (2023.02)
(58) Field of Classification Search
CPC ..... H01L 27/0207; H10B 12/00; H10B 12/03; H10B 12/05; H10B 53/20; H10B 53/30
See application file for complete search history.

(56) References Cited

U.S. PATENT DOCUMENTS

| 6,239,460 | B1* | 5/2001 | Kuroiwa | H01L 28/60 |
| | | | | 257/306 |
| 7,649,763 | B2 | 1/2010 | Takashima | |
| 9,806,082 | B2 | 10/2017 | Tanaka et al. | |
| 10,290,680 | B2 | 5/2019 | Tanaka | |
| 10,403,631 | B1 | 9/2019 | Lu et al. | |
| 10,529,720 | B2 | 1/2020 | Sills et al. | |

(Continued)

FOREIGN PATENT DOCUMENTS

| JP | 2018037441 A | 3/2018 |
| KR | 101032500 B1 | 5/2011 |

(Continued)

*Primary Examiner* — Mohammad M Hoque
*Assistant Examiner* — Kevin Quinto
(74) *Attorney, Agent, or Firm* — Muir Patent Law, PLLC

(57) ABSTRACT

A semiconductor memory device includes: a first word line extending in a vertical direction; a second word line spaced apart from the first word line in a first horizontal direction and extending in the vertical direction; a first semiconductor pattern of a ring-shaped horizontal cross-section surrounding the first word line and constituting a portion of a first cell transistor; a second semiconductor pattern of a ring-shaped horizontal cross-section surrounding the second word line and constituting a portion of a second cell transistor; a cell capacitor between the first semiconductor pattern and the second semiconductor pattern and including a first electrode, a second electrode, and a capacitor dielectric film; a first bit line opposite the cell capacitor with respect to the first semiconductor pattern and extending in a second horizontal direction; and a second bit line opposite the cell capacitor with respect to the second semiconductor pattern.

20 Claims, 43 Drawing Sheets

(56) References Cited

U.S. PATENT DOCUMENTS

| | | |
|---|---|---|
| 10,651,182 B2 | 5/2020 | Morris et al. |
| 2011/0294290 A1 | 12/2011 | Nakanishi et al. |
| 2014/0035018 A1 | 2/2014 | Lee |
| 2016/0118404 A1 | 4/2016 | Peng |
| 2019/0103406 A1 | 4/2019 | Tang et al. |
| 2020/0202900 A1 | 6/2020 | Kang et al. |
| 2020/0212041 A1 | 7/2020 | Machkaoutsan et al. |
| 2020/0227416 A1 | 7/2020 | Lilak et al. |
| 2020/0227418 A1 | 7/2020 | Kim et al. |
| 2020/0279598 A1 | 9/2020 | Jiang et al. |
| 2020/0279601 A1 | 9/2020 | Kim et al. |
| 2020/0388625 A1 | 12/2020 | Lee et al. |
| 2022/0139916 A1* | 5/2022 | Kwak .................. H10B 12/30 257/300 |

FOREIGN PATENT DOCUMENTS

| | | |
|---|---|---|
| KR | 101872122 B1 | 6/2018 |
| KR | 1020190095138 A | 8/2019 |
| TW | 201104839 A | 2/2011 |

* cited by examiner

SEMICONDUCTOR MEMORY DEVICE

CROSS-REFERENCE TO RELATED APPLICATION

This application is based on and claims priority under 35 U.S.C. § 119 to Korean Patent Application No. 10-2020-0181177, filed on Dec. 22, 2020, in the Korean Intellectual Property Office, the disclosure of which is incorporated by reference herein in its entirety.

BACKGROUND

The inventive concept relates to a semiconductor memory device, and more particularly, to a 3-dimensional semiconductor memory device.

As electronic products are required to have smaller sizes, be multi-functional, and have higher performance, semiconductor memory devices having high capacities are required, and an increased degree of integration is required to provide semiconductor memory devices having high capacities. Because the degrees of integration of semiconductor memory devices according to the related art are mainly determined by areas occupied by unit memory cells, the degrees of integration of 2-dimensional semiconductor memory devices have been increased but are still limited. Therefore, 3-dimensional semiconductor memory devices, which have increased memory capacities by stacking a plurality of memory cells in a vertical direction on a substrate, have been proposed.

SUMMARY

The inventive concept provides a 3-dimensional semiconductor memory device having an improved degree of integration.

According to an aspect of the inventive concept, there is provided a semiconductor memory device including: a first word line extending in a vertical direction over a substrate; a second word line arranged over the substrate to be spaced apart from the first word line in a first horizontal direction, the second word line extending in the vertical direction; a first semiconductor pattern having a ring-shaped horizontal cross-section that surrounds the first word line, the first semiconductor pattern constituting a portion of a first cell transistor; a second semiconductor pattern having a ring-shaped horizontal cross-section that surrounds the second word line, the second semiconductor pattern constituting a portion of a second cell transistor; a cell capacitor between the first semiconductor pattern and the second semiconductor pattern, the cell capacitor including a first electrode, a second electrode surrounding the first electrode, and a capacitor dielectric film between the first electrode and the second electrode; a first bit line arranged opposite the cell capacitor with respect to the first semiconductor pattern and extending in a second horizontal direction that is perpendicular to the first horizontal direction; and a second bit line arranged opposite the cell capacitor with respect to the second semiconductor pattern and extending in the second horizontal direction.

According to another aspect of the inventive concept, there is provided a semiconductor memory device including: a first word line extending in a vertical direction over a substrate; a second word line arranged over the substrate to be spaced apart from the first word line in a first horizontal direction, the second word line extending in the vertical direction; a first semiconductor pattern having a ring-shaped horizontal cross-section that surrounds the first word line, the first semiconductor pattern constituting a portion of a first cell transistor; a second semiconductor pattern having a ring-shaped horizontal cross-section that surrounds the second word line, the second semiconductor pattern constituting a portion of a second cell transistor; an insulating pillar arranged between the first semiconductor pattern and the second semiconductor pattern and extending in the vertical direction; a cell capacitor surrounding a sidewall of the insulating pillar and arranged between the first semiconductor pattern and the second semiconductor pattern, the cell capacitor including a first electrode electrically connected to the first semiconductor pattern, a second electrode surrounding the first electrode, and a capacitor dielectric film between the first electrode and the second electrode; a first bit line arranged opposite the cell capacitor with respect to the first semiconductor pattern and extending in a second horizontal direction that is perpendicular to the first horizontal direction; and a second bit line arranged opposite the cell capacitor with respect to the second semiconductor pattern and extending in the second horizontal direction.

According to yet another aspect of the inventive concept, there is provided a semiconductor memory device including: a first word line extending in a vertical direction over a substrate; a second word line arranged over the substrate to be spaced apart from the first word line in a first horizontal direction, the second word line extending in the vertical direction; a plurality of first semiconductor patterns arranged on a sidewall of the first word line to be spaced apart from each other in the vertical direction, the plurality of first semiconductor patterns constituting respective portions of a plurality of first cell transistors; a plurality of second semiconductor patterns arranged on a sidewall of the second word line to be spaced apart from each other in the vertical direction, the plurality of second semiconductor patterns constituting respective portions of a plurality of second cell transistors; a plurality of cell capacitors respectively disposed between the plurality of first semiconductor patterns and the plurality of second semiconductor patterns, each of the plurality of cell capacitors including a first electrode electrically connected to a corresponding one of the plurality of first semiconductor patterns, a second electrode surrounding the first electrode, and a capacitor dielectric film between the first electrode and the second electrode; a plurality of first bit lines electrically connected to the plurality of first semiconductor patterns respectively, the plurality of first bit lines spaced apart from each other in the vertical direction, the plurality of first bit lines extending in a second horizontal direction that is perpendicular to the first horizontal direction; and a plurality of second bit lines electrically connected to the plurality of second semiconductor patterns respectively, the plurality of second bit lines spaced apart from each other in the vertical direction, the plurality of second bit lines extending in the second horizontal direction.

BRIEF DESCRIPTION OF THE DRAWINGS

Embodiments of the inventive concept will be more clearly understood from the following detailed description taken in conjunction with the accompanying drawings in which:

FIGS. 9A to 24B are schematic diagrams illustrating a method of fabricating a semiconductor memory device, according to example embodiments; In particular, FIGS. 9A, 10A, 11A, 12A, 13A, 14A, 15A, 16A, 17A, 18A, 19A, 20A, 21A, 22A, 23A, and 24A are cross-sectional views taken along a line A1-A1' of FIG. 2, and FIGS. 9B, 10B, 11B, 12B, 13B, 14B, 15B, 16B, 17B, 18B, 19B, 20B, 21B, 22B, 23B, and 24B are horizontal cross-sectional views taken along a first vertical level LV1 of FIG. 3;

DETAILED DESCRIPTION OF THE EMBODIMENTS

Hereinafter, example embodiments of the inventive concept will be described in detail with reference to the accompanying drawings.

Figure 1:
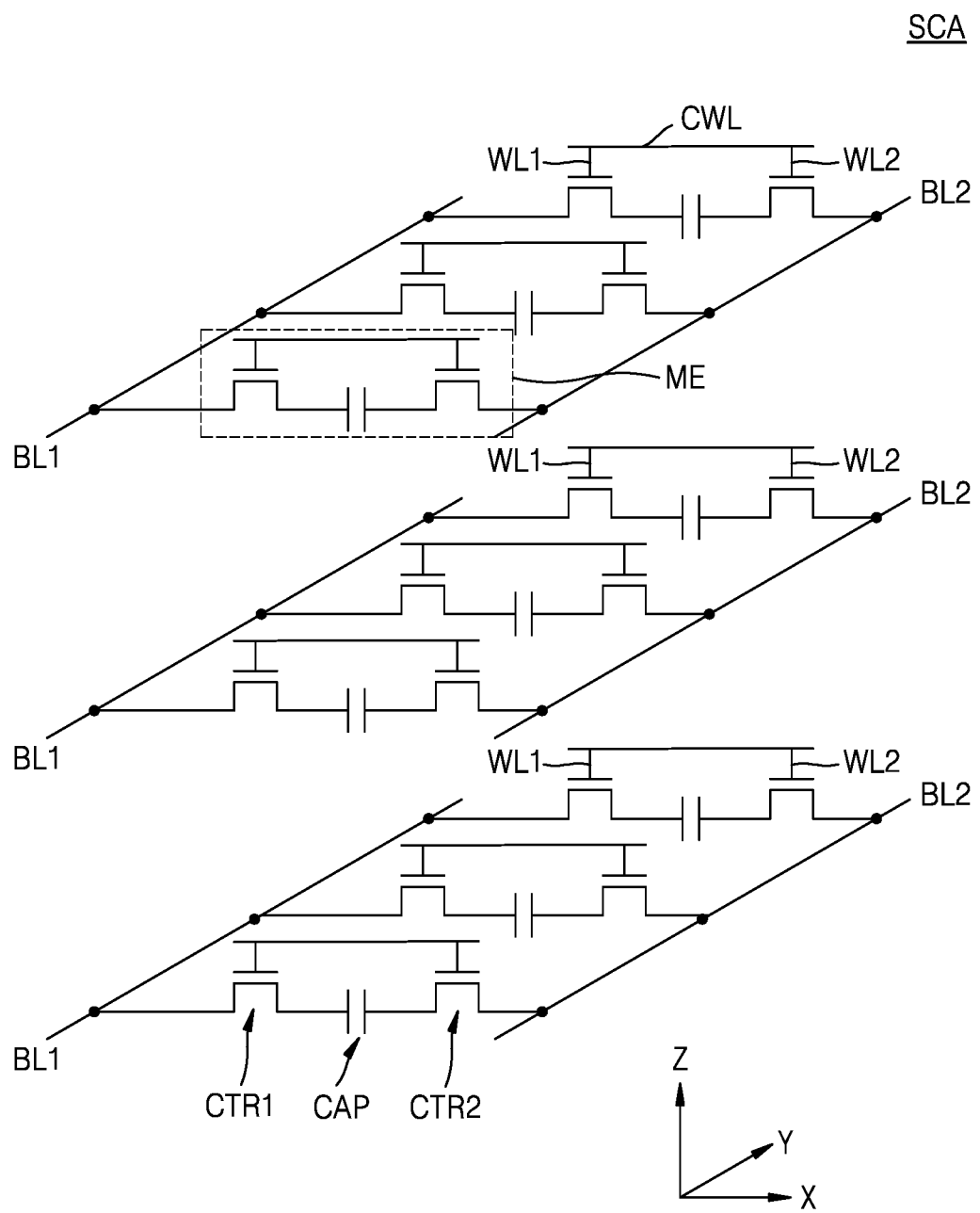
FIG. 1 is an equivalent circuit diagram illustrating a cell array of a semiconductor memory device according to example embodiments.

FIG. 1 is an equivalent circuit diagram illustrating a cell array of a semiconductor memory device according to example embodiments.

Referring to FIG. 1, the cell array of the semiconductor memory device may include a plurality of sub-cell arrays SCA. A sub-cell array SCA may include a plurality of first bit lines BL1, a plurality of second bit lines BL2, a plurality of first word lines WL1, and a plurality of second word lines WL2.

The sub-cell array SCA may include a plurality of memory units ME arranged in a second horizontal direction (Y direction) and a vertical direction (Z direction). One memory unit ME may include a first cell transistor CTR1, a second cell transistor CTR2, and a cell capacitor CAP. One first cell transistor CTR1 may be arranged between one first word line WL1 and one first bit line BL1, and one second cell transistor CTR2 may be arranged between one second word line WL2 and one second bit line BL2. One memory unit ME may be implemented by a 2 transistor-1 capacitor (2T-1C)-type semiconductor memory device.

The pluralities of first and second bit lines BL1 and BL2 may each include a conductive pattern (for example, a metal line) arranged over a substrate to be spaced apart from the substrate. For example, a lower structure may be formed under the first and second bit lines BL1 and BL2 and above the substrate. The pluralities of first and second bit lines BL1 and BL2 may extend in the second horizontal direction (Y direction). In one sub-cell array SCA, the plurality of first bit lines BL1 may be spaced apart from each other in the vertical direction (Z direction), and the plurality of second bit lines BL2 may be spaced apart from each other in the vertical direction (Z direction).

The pluralities of first and second word lines WL1 and WL2 may each include a conductive pattern (for example, a metal line) extending in a different direction from the first and second bit lines BL1 and BL2, and one first word line WL1 may be electrically connected to a second word line WL2 corresponding thereto. For example, each of the first word line WL1 and the second word line WL2 may extend in the vertical direction (Z direction), and the first word line WL1 may be electrically connected to the second word line WL2 via a common word line CWL.

A gate of the first cell transistor CTR1 may be electrically connected to the first word line WL1, a source of the first cell transistor CTR1 may be electrically connected to the first bit line BL1, and a drain of the first cell transistor CTR1 may be electrically connected to a first electrode (for example, a lower electrode LE (see FIG. 3)) of the cell capacitor CAP. A second electrode (for example, an upper electrode UE (see FIG. 3)) of the cell capacitor CAP may be electrically connected to a drain of the second cell transistor CTR2. A gate of the second cell transistor CTR2 may be electrically connected to the second word line WL2, and a source of the second cell transistor CTR2 may be electrically connected to the second bit line BL2.

In example embodiments, when one memory unit ME is selected (that is, when one memory unit ME is turned on), a power supply voltage VDD may be provided to the second bit line BL2, a ground voltage GND may be provided to the first bit line BL1, and charges may be stored in the cell capacitor CAP. When one memory unit ME is not selected (that is, when one memory unit ME is turned off), due to the charges stored in the cell capacitor CAP, a voltage of the second bit line BL2 may change up to a second saturation voltage VBL2 (see FIG. 25C) having a positive value, and a voltage of the first bit line BL1 may change up to a first saturation voltage VBL1 (see FIG. 25C) having a negative value. A bit line sense amplifier (not shown) may be configured to sense a voltage difference between the second bit line BL2 and the first bit line BL1. A 2T-1C-type semiconductor memory device driven in such a manner may have a relatively large voltage difference between the second bit line BL2 and the first bit line BL1 and may have a high sensing margin, as compared with 1 transistor-1 capacitor (1T-1C)-type semiconductor memory devices.

Figure 2:
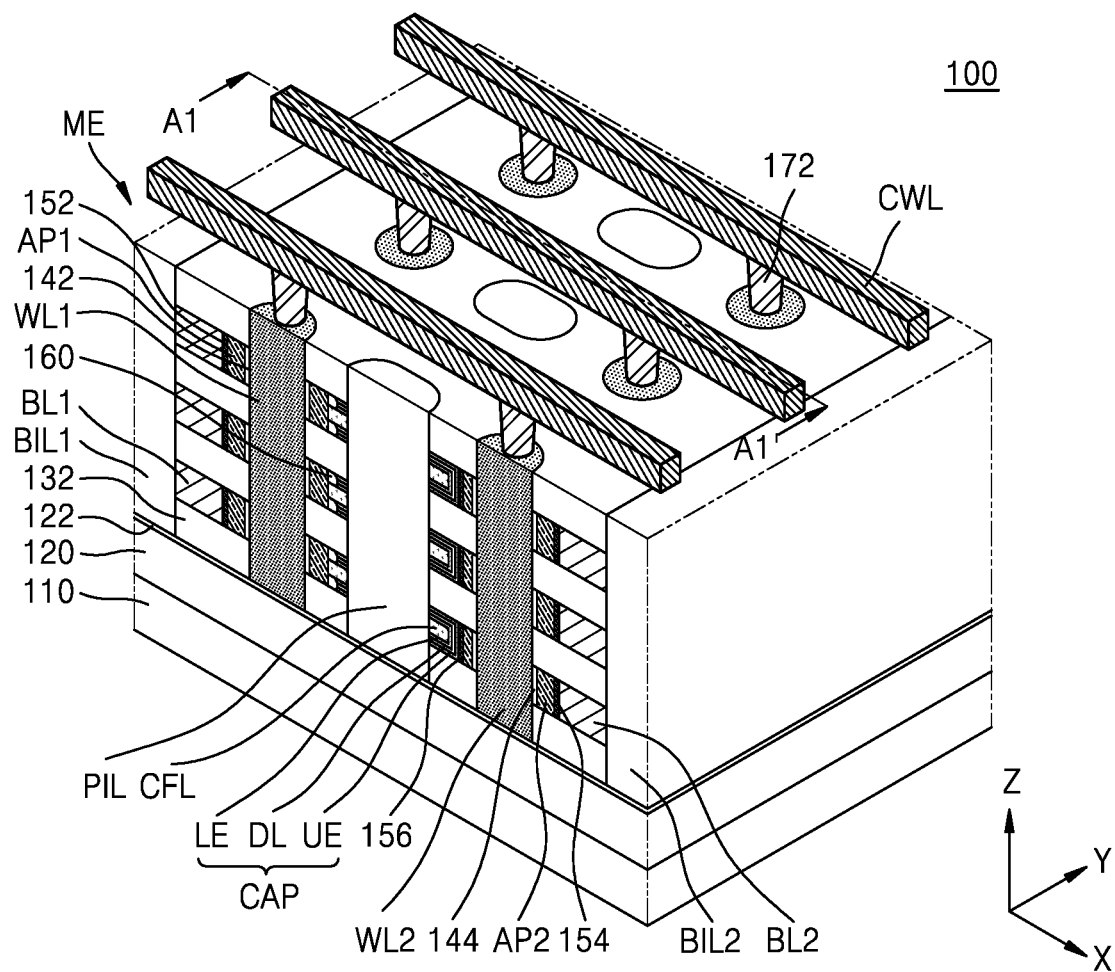
FIG. 2 is a perspective view illustrating a semiconductor memory device according to example embodiments.
Figure 3:
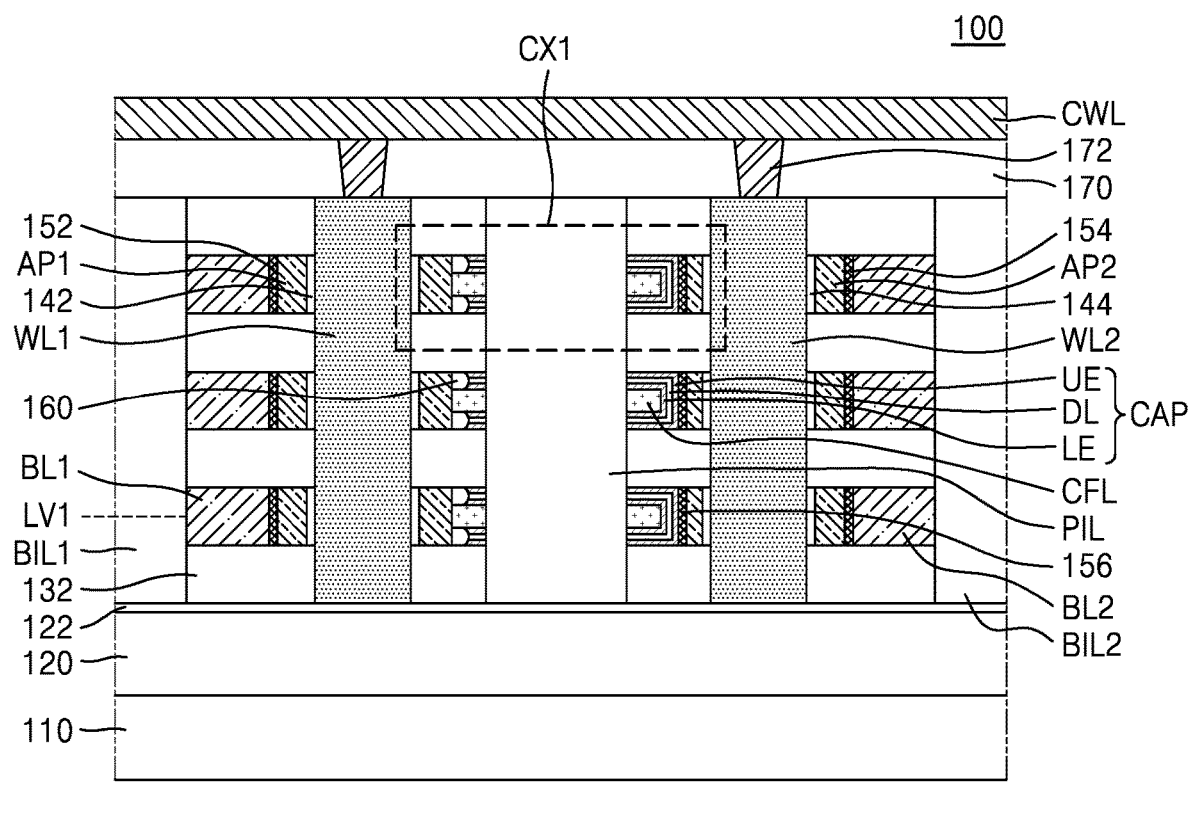
FIG. 3 is a cross-sectional view taken along a line A1-A1' of FIG. 2.
Figure 4:
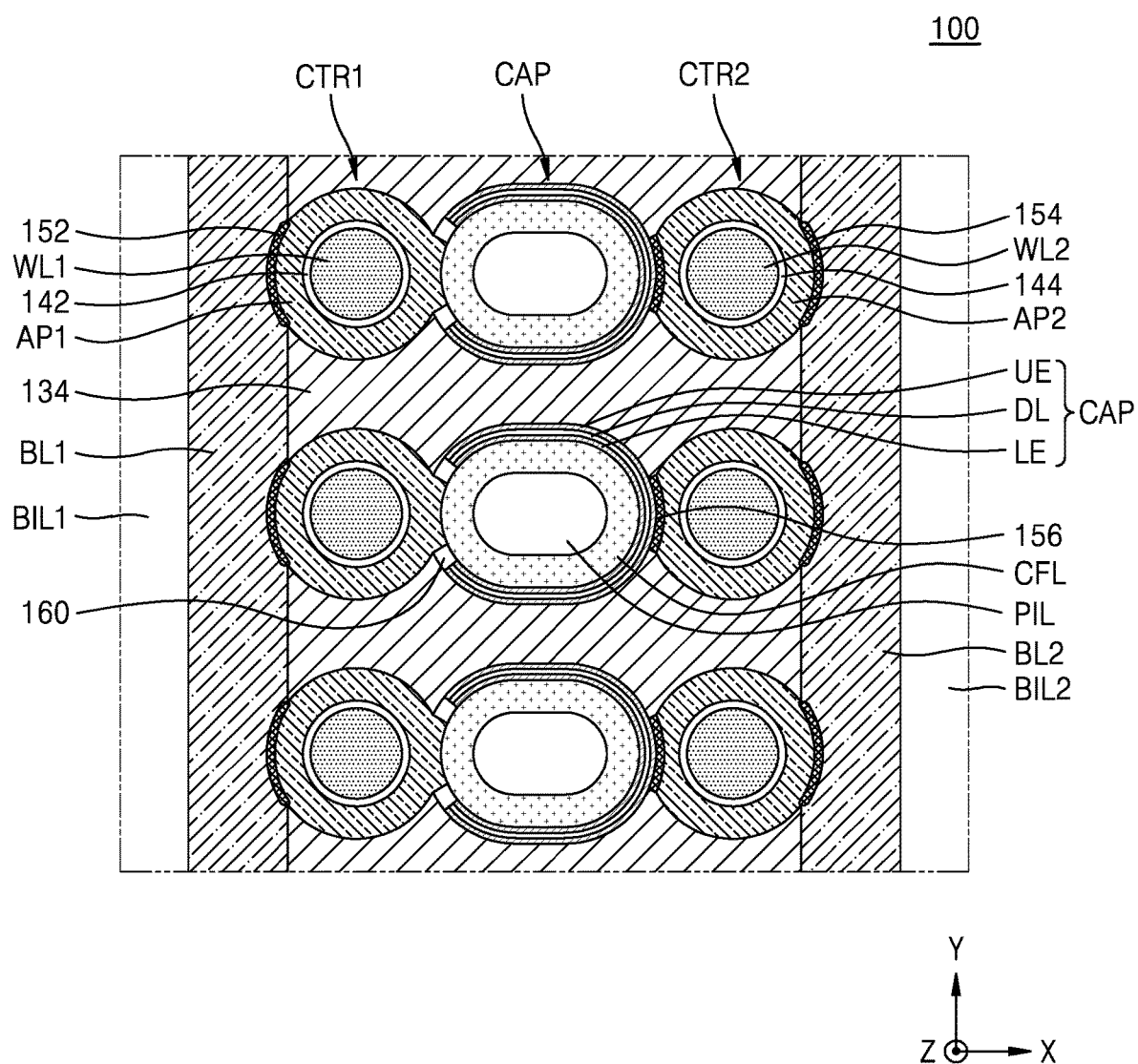
FIG. 4 is a horizontal cross-sectional view taken along a first vertical level LV1 of FIG. 3.
Figure 5:
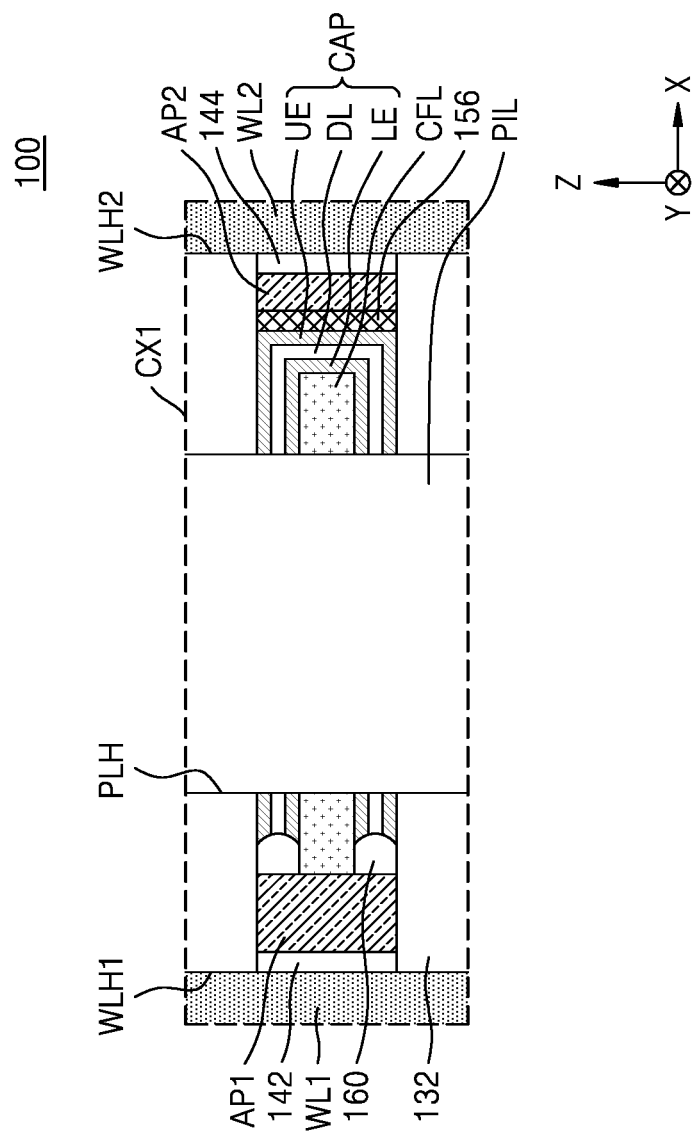
FIG. 5 is an enlarged view of a region CX1 of FIG. 3.

FIG. 2 is a perspective view illustrating a semiconductor memory device 100 according to example embodiments. FIG. 3 is a cross-sectional view taken along a line A1-A1' of FIG. 2, and FIG. 4 is a horizontal cross-sectional view taken along a first vertical level LV1 of FIG. 3. FIG. 5 is an enlarged view of a region CX1 of FIG. 3.

Referring to FIGS. 2 to 5, the semiconductor memory device 100 may include the pluralities of first and second bit lines BL1 and BL2, the pluralities of first and second word lines WL1 and WL2, and the plurality of memory units ME, which are arranged on/over a substrate 110.

The substrate 110 may include or be formed of Si, Ge, or SiGe. Alternatively, for example, the substrate 110 may include or may be a silicon-on-insulator (SOI) substrate or a germanium-on-insulator (GeOI) substrate.

A lower structure 120 may be arranged on the substrate 110. The lower structure 120 may include a peripheral circuit (not shown), a wiring layer (not shown) connected to the peripheral circuit, and an insulating layer (not shown) covering the peripheral circuit and the wiring layer. An etch stop layer 122 may be arranged on the lower structure 120. The etch stop layer 122 may include or be formed of silicon nitride or silicon oxide.

During a manufacturing process which will be described in detail below, a plurality of mold insulating layers 132 and a plurality of sacrificial insulating layers 134 may be alternately arranged on the etch stop layer 122. The plurality of mold insulating layers 132 and the plurality of sacrificial insulating layers 134 may each include at least one of silicon oxide, silicon nitride, and silicon oxynitride. In example embodiments, the plurality of mold insulating layers 132 and the plurality of sacrificial insulating layers 134 may include or be formed of materials having etch selectivity with respect to each other. For example, a mold insulating layer 132 may include or be formed of silicon oxide, and a sacrificial insulating layer 134 may include or be formed of silicon nitride.

Figure 10A:
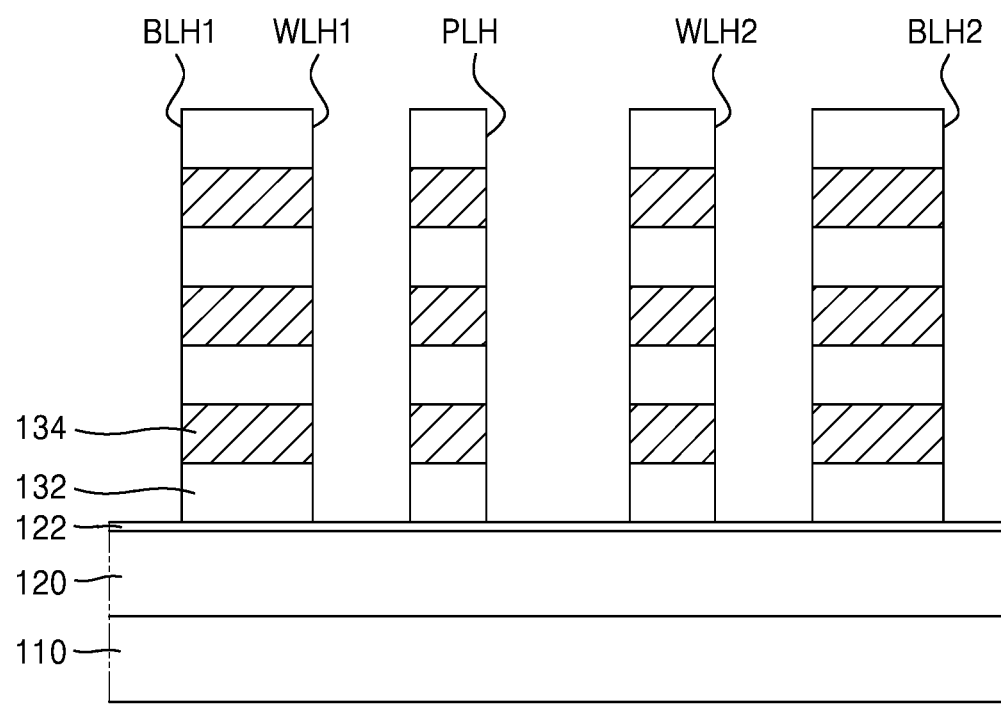
Figure 24A:
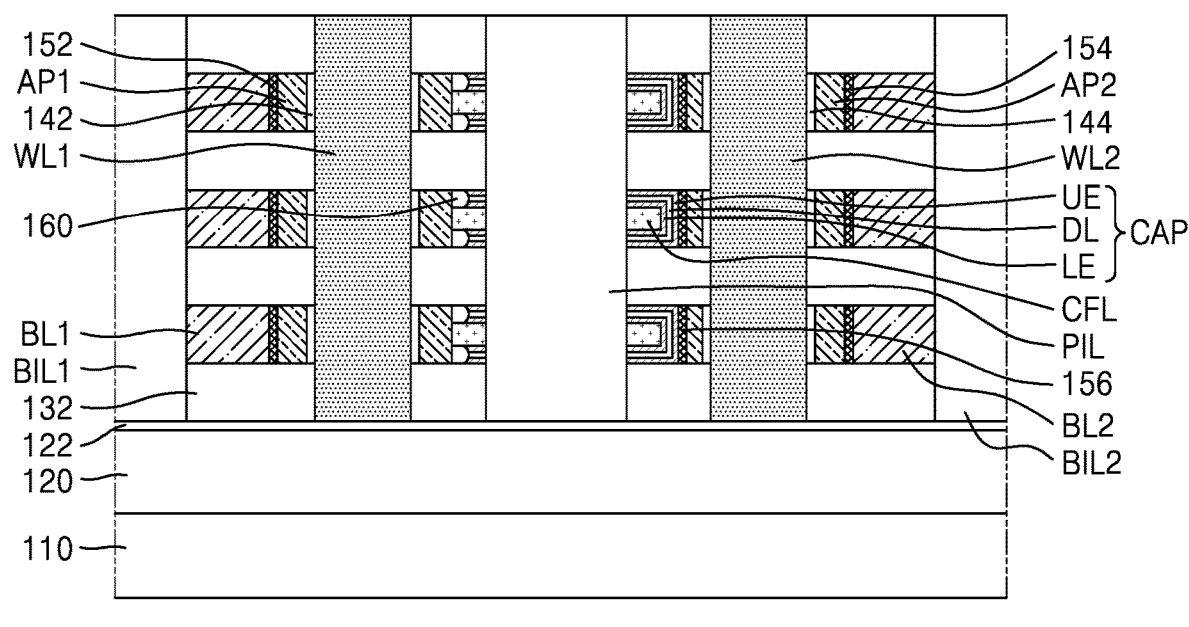

The plurality of first word lines WL1 may be spaced apart from each other in the second horizontal direction (Y direction) and may extend in the vertical direction (Z direction). The plurality of first word lines WL1 may be arranged in a plurality of first word line holes WLH1, which pass through the plurality of mold insulating layers 132 and the plurality of sacrificial insulating layers 134. For example, the first word line holes WLH1 may be formed through the plurality of mold insulating layers 132 and the plurality of sacrificial insulating layers 134 during a manufacturing process of the semiconductor memory device 100 as shown in FIG. 10A, and the first word lines WL1 may be formed in the first word line holes WLH1 after the sacrificial insulating layers 134 are replaced with first gate insulating layers 142 and first semiconductor patterns AP1 on side walls of the first word line holes WLH1 as shown in FIG. 24A.

The plurality of second word lines WL2 may be spaced apart from the plurality of first word lines WL1 in a first horizontal direction (X direction) and may extend in the vertical direction (Z direction). The plurality of second word lines WL2 may be arranged in a second word line hole WLH2, which passes through the plurality of mold insulating layers 132 and the plurality of sacrificial insulating layers 134. For example, the second word line holes WLH2 may be formed through the plurality of mold insulating layers 132 and the plurality of sacrificial insulating layers 134 during a manufacturing process of the semiconductor memory device 100 as shown in FIG. 10A, and the second word lines WL2 may be formed in the second word line holes WLH2 after the sacrificial insulating layers 134 are replaced with second gate insulating layers 144 and second semiconductor patterns AP2 on side walls of the second word line holes WLH2 as shown in FIG. 24A.

Each of the pluralities of first and second word lines WL1 and WL2 may include at least one of a doped semiconductor material (doped silicon, doped germanium, or the like), a conductive metal nitride (titanium nitride, tantalum nitride, or the like), a metal (tungsten, titanium, tantalum, or the like), and a metal-semiconductor compound (tungsten silicide, cobalt silicide, titanium silicide, or the like). Although FIG. 4 illustrates an example in which each of the first and second word lines WL1 and WL2 has a horizontal cross-section having a circular shape, the inventive concept is not limited thereto.

A plurality of first semiconductor patterns AP1 may be arranged on a sidewall of each of the plurality of first word lines WL1 to be spaced apart from each other in the vertical direction (Z direction). Each of the plurality of first semiconductor patterns AP1 may have a ring shape surrounding the sidewall of the first word line WL1. Each mold insulating layer 132 may be arranged between the plurality of first semiconductor patterns AP1 and may cover each of the sidewalls of the plurality of first word lines WL1, which are not covered by the plurality of first semiconductor patterns AP1.

A plurality of second semiconductor patterns AP2 may be arranged on a sidewall of each of the plurality of second word lines WL2 to be spaced apart from each other in the vertical direction (Z direction). Each of the plurality of second semiconductor patterns AP2 may have a ring shape surrounding the sidewall of the second word line WL2. Each mold insulating layer 132 may be arranged between the plurality of second semiconductor patterns AP2 and may cover each of the sidewalls of the plurality of second word lines WL2, which are not covered by the plurality of second semiconductor patterns AP2.

The pluralities of first and second semiconductor patterns AP1 and AP2 may each include or be formed of, for example, an undoped semiconductor material or a doped semiconductor material. In some embodiments, the pluralities of first and second semiconductor patterns AP1 and AP2 may each include or be formed of polysilicon. In some embodiments, the pluralities of first and second semiconductor patterns AP1 and AP2 may each include an amorphous metal oxide, a polycrystalline metal oxide, a combination of an amorphous metal oxide and a polycrystalline metal oxide, or the like, for example, at least one of an In—Ga oxide (IGO), an In—Zn oxide (IZO), and an In—Ga—Zn oxide (IGZO). In some other embodiments, the pluralities of first and second semiconductor patterns AP1 and AP2 may each include or be formed of a 2-dimensional (2D) material semiconductor (2D semiconductor), and the 2D material semiconductor may include or may be, for example, $MoS_2$, $WSe_2$, graphene, carbon nanotubes, or a combination thereof.

Although not shown, a portion of each of the plurality of first semiconductor patterns AP1 and a portion of each of the plurality of second semiconductor patterns AP2 may be impurity regions doped with impurities. For example, a portion of the first semiconductor pattern AP1, which is adjacent to the first bit line BL1, and a portion of the first semiconductor pattern AP1, which is adjacent to the cell capacitor CAP, may be regions doped with impurities at a high concentration. For example, concentration rates of impurity within the first semiconductor pattern AP1 may vary depending on position. A portion of the second semiconductor pattern AP2, which is adjacent to the second bit line BL2, and a portion of the second semiconductor pattern AP2, which is adjacent to the cell capacitor CAP, may be regions doped with impurities at a high concentration. For example, concentration rates of impurity within the second semiconductor pattern AP2 may vary depending on position.

A first gate insulating layer 142 may be arranged between the first word line WL1 and the first semiconductor pattern AP1, and a second gate insulating layer 144 may be arranged between the second word line WL2 and the second semiconductor pattern AP2.

In some embodiments, as shown in FIG. 3, the first gate insulating layer 142 may cover only a portion of the sidewall of the first word line WL1, which is surrounded by the first semiconductor pattern AP1. In this case, the first gate insulating layer 142 may not be arranged on a portion of the sidewall of the first word line WL1, which is surrounded by the mold insulating layer 132, and the mold insulating layer 132 may contact the sidewall of the first word line WL1. In addition, the second gate insulating layer 144 may cover only a portion of the sidewall of the second word line WL2, which is surrounded by the second semiconductor pattern AP2.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

In other embodiments, unlike the example shown in FIG. 3, the first gate insulating layer 142 may extend in the vertical direction (Z direction) throughout the total height of the first word line WL1 to cover the entire sidewall of the first word line WL1. In this case, the first gate insulating layer 142 may be arranged between the mold insulating layer 132 and the first word line WL1, and the mold insulating layer 132 may not contact the first word line WL1. In addition, the second gate insulating layer 144 may extend in the vertical direction (Z direction) throughout the total height of the second word line WL2 to cover the entire sidewall of the second word line WL2.

In example embodiments, each of the first and second gate insulating layers 142 and 144 may include at least one selected from a high-k dielectric material, which has a higher dielectric constant than silicon oxide, and a ferroelectric material. In some embodiments, each of the first and second gate insulating layers 142 and 144 may include at least one selected from among hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), lead zirconium titanate (PZT), strontium bismuth tantalate (SBT), bismuth iron oxide (BFO), strontium titanium oxide (SrTiO), yttrium oxide (YO), aluminum oxide (AlO), and lead scandium tantalum oxide (PbScTaO).

A portion of the first word line WL1, the first semiconductor pattern AP1 surrounding the portion of the first word line WL1, and the first gate insulating layer 142 between the first word line WL1 and the first semiconductor pattern AP1 may constitute the first cell transistor CTR1. A portion of the second word line WL2, the second semiconductor pattern AP2 surrounding the portion of the second word line WL2, and the second gate insulating layer 144 between the second word line WL2 and the second semiconductor pattern AP2 may constitute the second cell transistor CTR2.

The plurality of first bit lines BL1 may be arranged apart from each other in the vertical direction (Z direction) to extend in the second horizontal direction (Y direction) while being adjacent to one-side ends of the plurality of first semiconductor patterns AP1. For example the plurality of first bit lines BL1 may contact and/or be electrically connected to the plurality of first semiconductor patterns AP1 respectively. The mold insulating layer 132 may be arranged between two first bit lines BL1 adjacent to each other in the vertical direction (Z direction). For example, the mold insulating layers 132 and the first bit lines BL1 may be alternately stacked in the vertical direction Z. The plurality of second bit lines BL2 may be arranged apart from each other in the vertical direction (Z direction) to extend in the second horizontal direction (Y direction) while being adjacent to one-side ends of the plurality of second semiconductor patterns AP2. For example the plurality of second bit lines BL2 may contact and/or be electrically connected to the plurality of second semiconductor patterns AP2 respectively. The mold insulating layer 132 may be arranged between two second bit lines BL2 adjacent to each other in the vertical direction (Z direction). For example, the mold insulating layers 132 and the second bit lines BL2 may be alternately stacked in the vertical direction Z. Each of the pluralities of first and second bit lines BL1 and BL2 may include or be formed of one of a doped semiconductor material, a conductive metal nitride, a metal, and a metal-semiconductor compound.

A first contact layer 152 may be arranged between each of the plurality of first bit lines BL1 and a corresponding one of the plurality of first semiconductor patterns AP1 connected thereto. A second contact layer 154 may be arranged between each of the plurality of second bit lines BL2 and a corresponding one of the plurality of second semiconductor patterns AP2 connected thereto. Each of the first and second contact layers 152 and 154 may include or be formed of a metal silicide material, for example, at least one of titanium silicide, tungsten silicide, cobalt silicide, and nickel silicide.

Figure 11A:
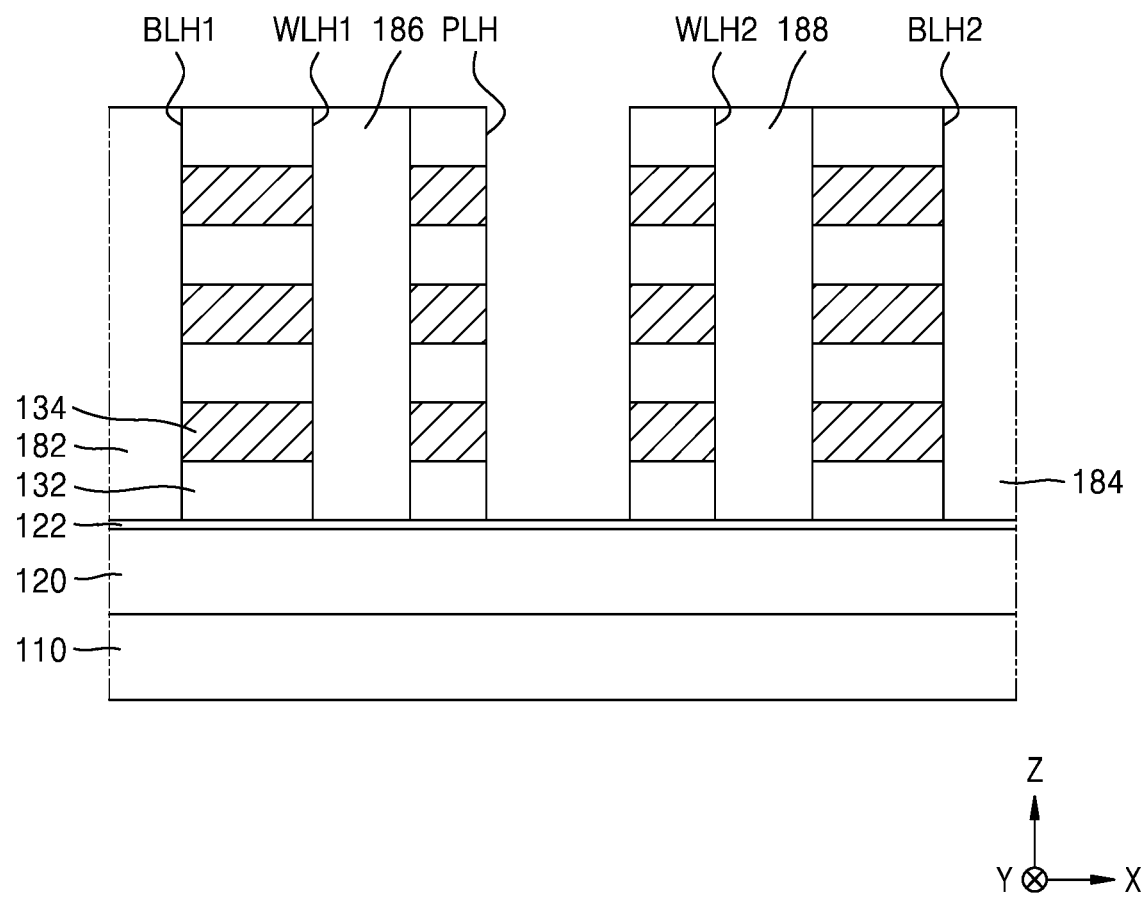
Figure 15A:
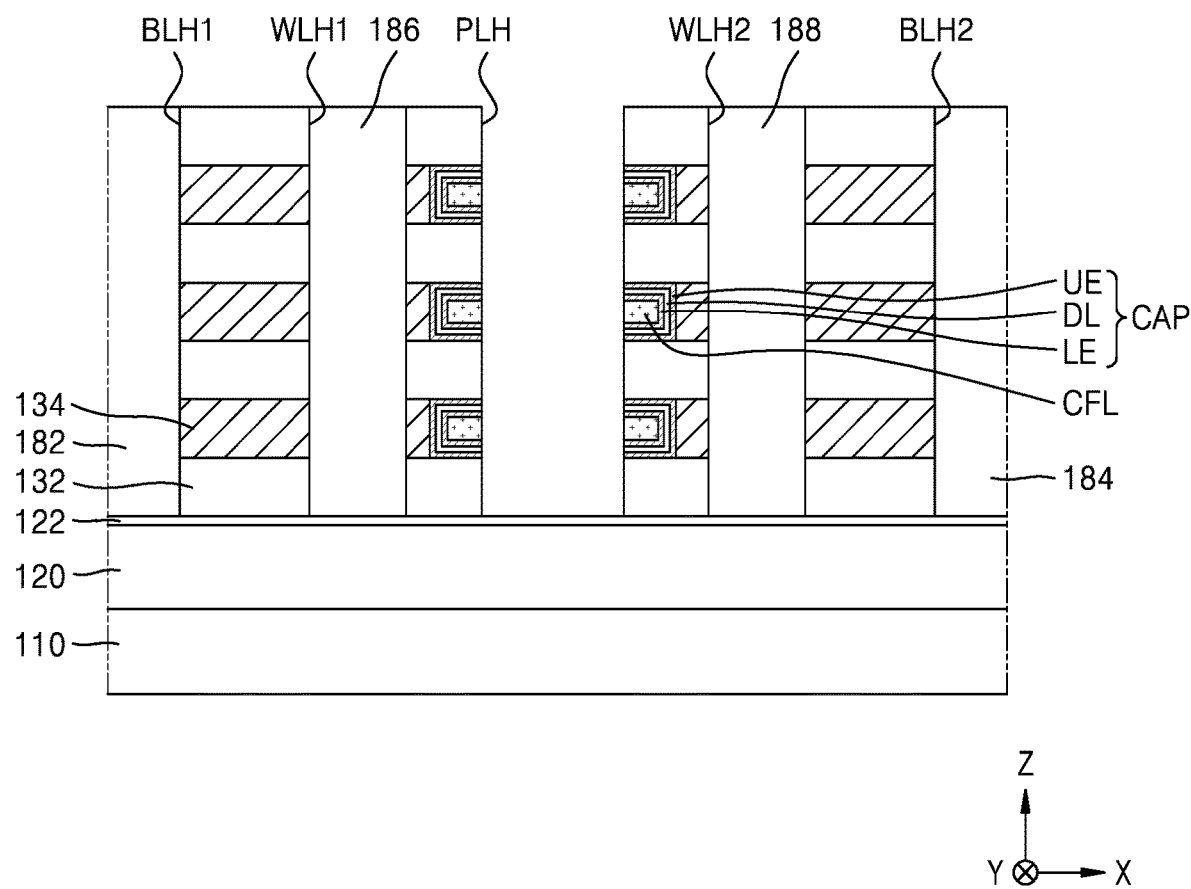
Figure 16A:
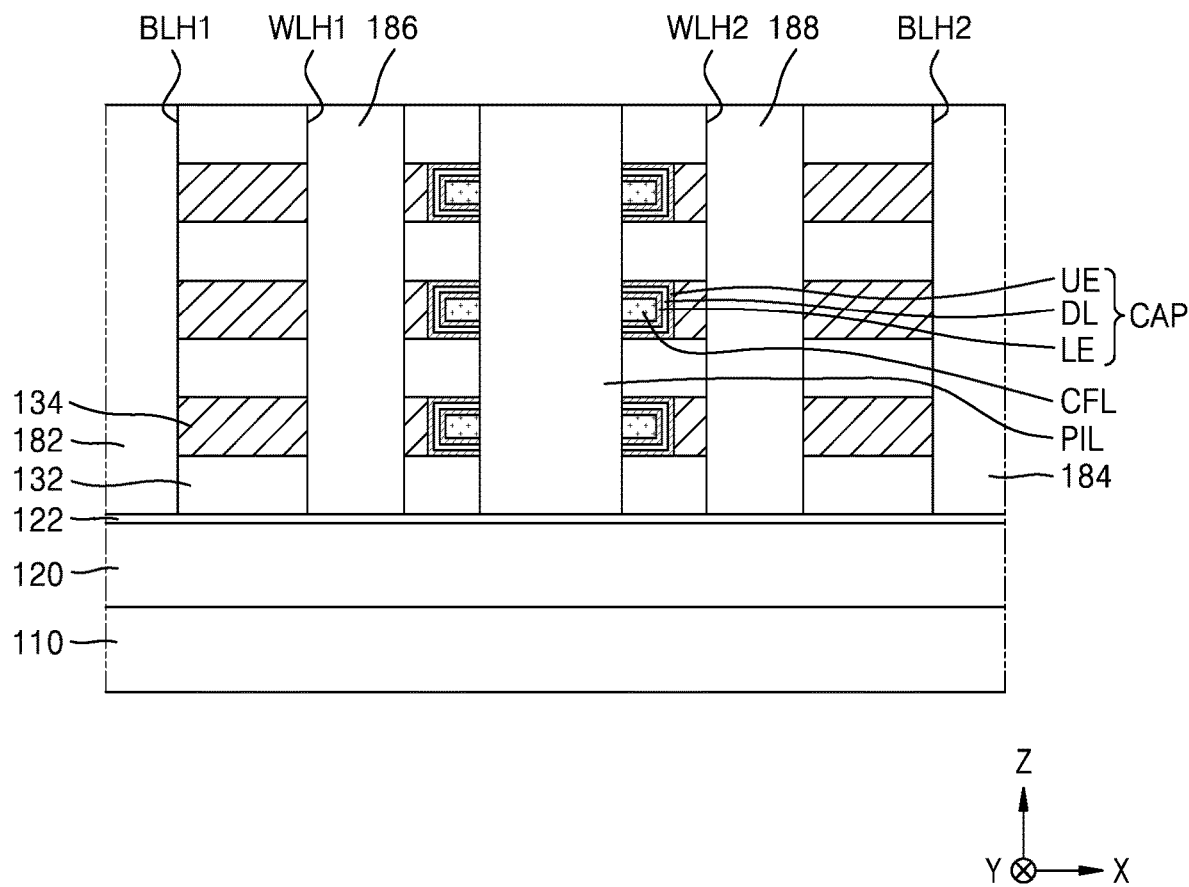

A plurality of insulating pillars PIL, which are spaced apart from each other in the second horizontal direction (Y direction) and extend in the vertical direction (Z direction), may be arranged between the first semiconductor pattern AP1 and the second semiconductor pattern AP2 that is spaced apart from the first semiconductor pattern AP1 in the first horizontal direction (X direction), and a conductive filling layer CFL and a cell capacitor CAP may be arranged on a sidewall of each insulating pillar PIL. Each of the plurality of insulating pillars PIL may be arranged in an insulating pillar hole PLH, which passes through the plurality of mold insulating layers 132 and the plurality of sacrificial insulating layers 134. For example, insulating pillar holes PLH may be formed through the plurality of mold insulating layers 132 and the plurality of sacrificial insulating layers 134 during a manufacturing process of the semiconductor memory device 100 as shown in FIGS. 10A and 11A, and the insulating pillars PIL may be formed in the insulating pillar holes PLH after the sacrificial insulating layers 134 are replaced with cell capacitors CAP and conductive filling layers CFL on side walls of the insulating pillar holes PLH as shown in FIGS. 15A and 16A.

The conductive filling layer CFL may surround a sidewall of an insulating pillar PIL and may have a horizontal cross-section having a ring shape. For example, in FIG. 4, the insulating pillar PIL may have a horizontal cross-section having an elliptical shape, and the conductive filling layer CFL may have a ring shape surrounding the insulating pillar PIL. However, the shape of the horizontal cross-section of the insulating pillar PIL and the shape of the horizontal cross-section of the conductive filling layer CFL are not limited to the examples shown in FIG. 4. As shown in FIG. 4, in a plan view, an inner sidewall of the conductive filling layer CFL may completely surround the insulating pillar PIL, and a portion of an outer sidewall of the conductive filling layer CFL may contact the first semiconductor pattern AP1. In example embodiments, the conductive filling layer CFL may include or be formed of polysilicon doped with n-type impurities.

The cell capacitor CAP may be arranged on the sidewall of the insulating pillar PIL to cover a top surface, a bottom surface, and the outer sidewall of the conductive filling layer CFL. The cell capacitor CAP may include a lower electrode LE, a capacitor dielectric film DL, and an upper electrode UE, which are sequentially stacked in the stated order to cover the conductive filling layer CFL. The lower electrode LE may contact the conductive filling layer CFL, and the upper electrode UE may be electrically connected to the second semiconductor pattern AP2.

As shown in FIG. 5, the lower electrode LE may have a vertical cross-section having a 90 degree-rotated U shape, and the upper electrode UE may have a vertical cross-section having a 90 degree-rotated U shape. The capacitor dielectric film DL may be arranged between the lower electrode LE and the upper electrode UE and, similar to the lower electrode LE and the upper electrode UE, may have a vertical cross-section having a 90 degree-rotated U shape. The cell capacitor CAP may be conformally arranged on the top surface, the outer sidewall, and the bottom surface of the conductive filling layer CFL, and a portion of the sidewall of the insulating pillar PIL may be surrounded by the lower electrode LE and the upper electrode UE.

In a plan view, the cell capacitor CAP may surround a portion of the sidewall of the insulating pillar PIL and a portion of a sidewall of the conductive filling layer CFL. For example, a portion of the sidewall of the conductive filling layer CFL may contact the first semiconductor pattern AP1, the cell capacitor CAP may be spaced apart from the first semiconductor pattern AP1, and an isolation insulating layer 160 may be arranged on the top surface, the bottom surface, and the sidewall of the conductive filling layer CFL to fill a space between the first semiconductor pattern AP1 and the cell capacitor CAP.

In example embodiments, each of the lower electrode LE and the upper electrode UE may include or be formed of a doped semiconductor material, a conductive metal nitride such as titanium nitride, tantalum nitride, niobium nitride, or tungsten nitride, a metal such as ruthenium, iridium, titanium, or tantalum, or a conductive metal oxide such as iridium oxide or niobium oxide.

The capacitor dielectric film DL may include or be formed of at least one selected from a high-k dielectric material, which has a higher dielectric constant than silicon oxide, and a ferroelectric material. In some embodiments, the capacitor dielectric film DL may include or be formed of at least one selected from among hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), lead zirconium titanate (PZT), strontium bismuth tantalate (SBT), bismuth iron oxide (BFO), strontium titanium oxide (SrTiO), yttrium oxide (YO), aluminum oxide (AlO), and lead scandium tantalum oxide (PbScTaO).

A capacitor contact layer 156 may be arranged between the second semiconductor pattern AP2 and the upper electrode UE electrically connected thereto. The capacitor contact layer 156 may include or be formed of a metal silicide material, for example, at least one of titanium silicide, tungsten silicide, cobalt silicide, and nickel silicide.

In example embodiments, the first semiconductor pattern AP1 constituting a portion of the first cell transistor CTR1 may be electrically connected to the lower electrode LE of the cell capacitor CAP via the conductive filling layer CFL. The second semiconductor pattern AP2 constituting a portion of the second cell transistor CTR2 may be electrically connected to the upper electrode UE of the cell capacitor CAP via the capacitor contact layer 156.

A first filling insulating layer BIL1, which extends in the second horizontal direction (Y direction), may be arranged on one side of the plurality of first bit lines BL1, and a second filling insulating layer BIL2, which extends in the second horizontal direction (Y direction), may be arranged on one side of the plurality of second bit lines BL2.

An upper insulating layer 170 may be arranged on an uppermost mold insulating layer 132, the plurality of first word lines WL1, the plurality of second word lines WL2, the insulating pillar PIL, and the first and second filling insulating layers BIL1 and BIL2. A plurality of common word lines CWL, which extend in the first horizontal direction (X direction), may be arranged on the upper insulating layer 170.

Word line contacts 172 may pass through the upper insulating layer 170 and be arranged between the common word line CWL and the first word line WL1 and between the common word line CWL and the second word line WL2. The first word line WL1 and the second word line WL2, which are arranged apart from each other in the first horizontal direction (X direction), may be electrically connected to the common word line CWL via the word line contacts 172. Accordingly, the first bit line BL1, the first word line WL1, the first cell transistor CTR1, the cell capacitor CAP, the second cell transistor CTR2, the second word line WL2, and the second bit line BL2 may form a 2T-1C-type semiconductor memory device.

According to the above-described example embodiments, because 2T-1C-type memory units ME may be stacked in the vertical direction (Z direction), the semiconductor memory device 100 may have an improved degree of integration and also have an improved sensing margin.

In addition, according to structures of the related art, in which a cell transistor and a capacitor are arranged at different levels from each other in the vertical direction, a degree of difficulty of a fabrication process for implementing a 2T-1C-type semiconductor memory device may be significantly high. Further, in structures in which a first cell transistor, a capacitor, and a second cell transistor are stacked in the vertical direction, because a line length from a peripheral circuit, such as a bit line sense amplifier, to a first bit line is different from a line length from the peripheral circuit to a second bit line, a signal delay or a signal time mismatch may occur. However, according to example embodiments, because the first cell transistor CTR1, the cell capacitor CAP, and the second cell transistor CTR2 are sequentially arranged in the stated order in the first horizontal direction (X direction), the line length from the peripheral circuit to the first bit line may be equal to the line length from the peripheral circuit to the second bit line, and thus, the occurrence of a signal delay or a signal time mismatch may be prevented. In addition, a degree of difficulty of a fabrication process for forming this structure may be reduced.

Hereinafter, a sensing method in a 2T-1C-type semiconductor memory device will be schematically described with reference to FIGS. 25A to 25C.

Figure 25A:
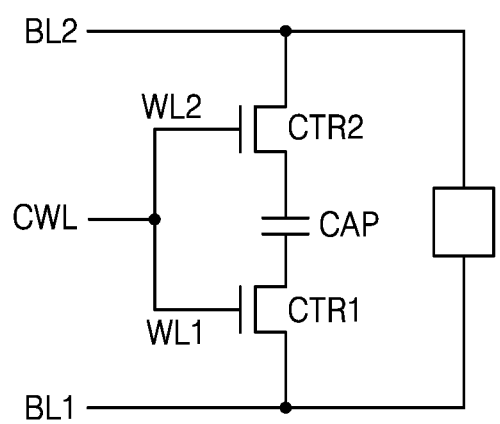
FIG. 25A is a circuit diagram of a semiconductor memory device according to example embodiments.
Figure 25B:
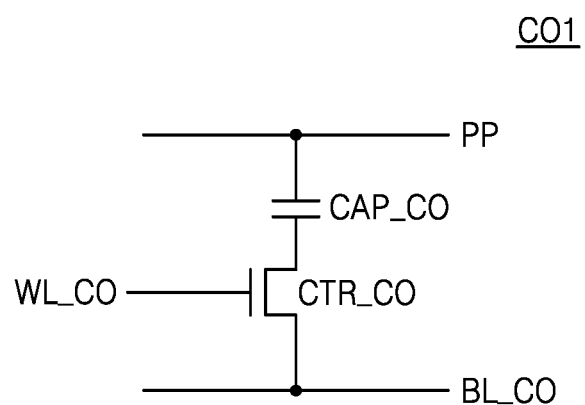
FIG. 25B is a circuit diagram of a semiconductor memory device according to a comparative example.
Figure 25C:
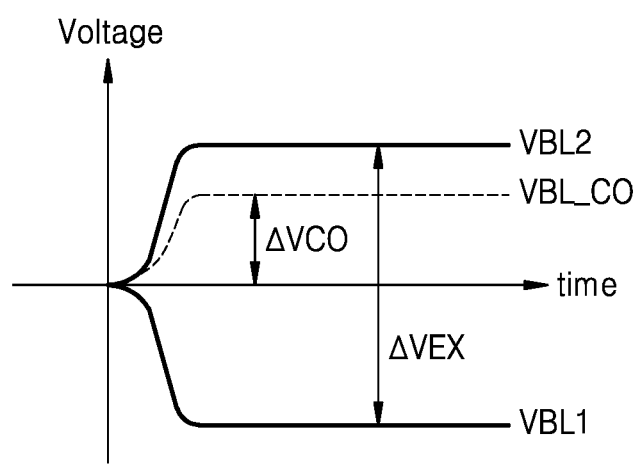
FIG. 25C is a graph schematically depicting a change in bit line voltage of a semiconductor memory device, according to example embodiments.

FIG. 25A is a circuit diagram of a semiconductor memory device EX1 according to example embodiments, FIG. 25B is a circuit diagram of a semiconductor memory device CO1 according to a comparative example, and FIG. 25C is a graph schematically depicting a change in bit line voltage of the semiconductor memory device EX1 according to example embodiments.

Referring to FIG. 25A, the semiconductor memory device EX1 according to example embodiments may be a 2T-1C-type semiconductor memory device. As described with reference to FIG. 2, the cell capacitor CAP may be connected between the first cell transistor CTR1 and the second cell transistor CTR2, and the same control signal may be applied to the first cell transistor CTR1 and the second cell transistor CTR2 from the common word line CWL.

Referring to FIG. 25B, the semiconductor memory device CO1 according to the comparative example may be a 1T-1C-type semiconductor memory device. A word line WL_CO may be connected to a gate of a cell transistor CTR_CO, a bit line BL_CO may be connected to a source of the cell transistor CTR_CO, a first electrode of a cell capacitor CAP_CO may be connected to a drain of the cell transistor CTR_CO, and a second electrode of the cell capacitor CAP_CO may be connected to a ground wiring line PP.

Referring to FIG. 25C, when a control signal is applied to the word line WL_CO of the semiconductor memory device CO1 according to the comparative example, the cell transistor CTR_CO may be turned on, and a voltage of the bit line BL_CO may reach a saturation voltage VBL_CO due to charges stored in the cell capacitor CAP_CO. Here, a sensing margin ΔVCO of the semiconductor memory device CO1 is represented by the same value as the saturation voltage VBL_CO and is measured to be a value of about 90 mV as a result of a simulation.

On the other hand, when a control signal is applied to the common word line CWL of the semiconductor memory device EX1 according to example embodiments, due to charges stored in the cell capacitor CAP, a voltage of the second bit line BL2 may change up to a second saturation voltage VBL2 and a voltage of the first bit line BL1 may change up to a first saturation voltage VBL1. Here, a sensing margin ΔVEX of the semiconductor memory device EX1 is represented by a difference between the second saturation voltage VBL2 and the first saturation voltage VBL1 and is measured to be a value of about 300 mV as a result of a simulation.

Accordingly, the semiconductor memory device EX1 according to example embodiments may have a significantly improved sensing margin as compared with the semiconductor memory device CO1 according to the comparative example.

Figure 6:
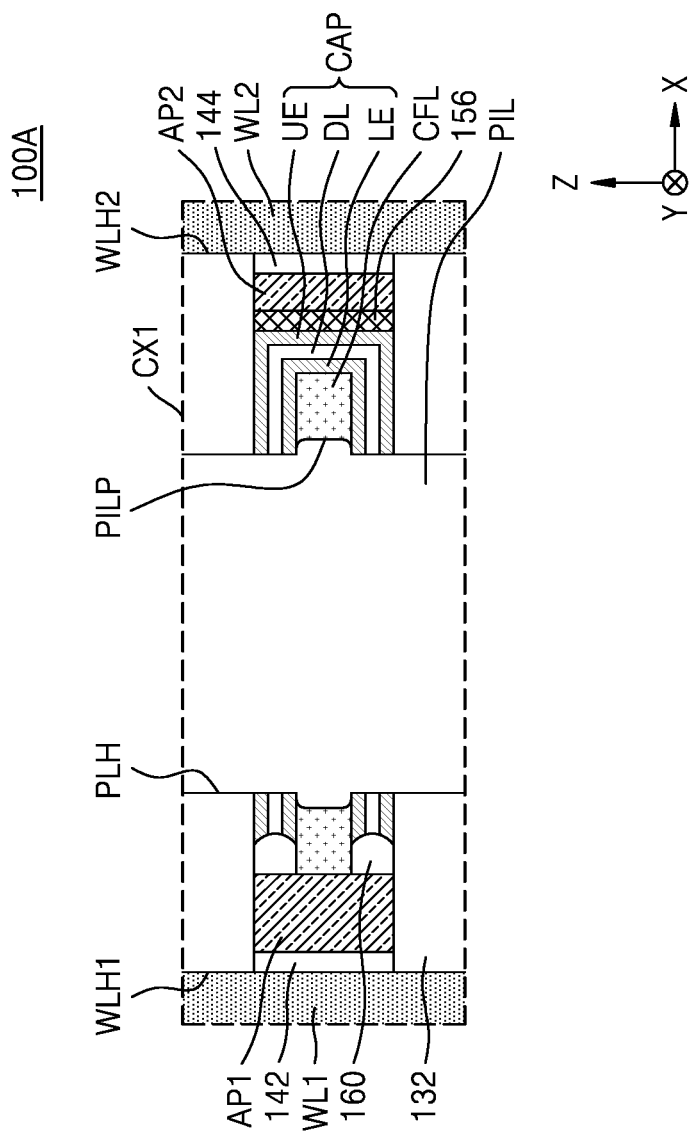
FIG. 6 is a cross-sectional view illustrating a semiconductor memory device according to example embodiments.

FIG. 6 is a cross-sectional view illustrating a semiconductor memory device 100A according to example embodiments. FIG. 6 is an enlarged view of a region of the semiconductor memory device 100A, which corresponds to the region CX1 of FIG. 3.

Referring to FIG. 6, the conductive filling layer CFL may have a sidewall recessed from the sidewall of the cell capacitor CAP. The insulating pillar PIL may have a protrusion PILP protruding toward the conductive filling layer CFL, and the protrusion PILP may be surrounded by the recessed sidewall of the conductive filling layer CFL. For example, the protrusion PILP may contact the conductive filling layer CFL along an inner wall of the conductive filling layer CFL.

In example embodiments, the insulating pillar hole PLH may be formed through the plurality of mold insulating layers 132 and the plurality of sacrificial insulating layers 134 during a manufacturing process, an expansion space PEX (see FIG. 12B) may be formed by removing, by a wet etching process, the plurality of sacrificial insulating layers 134 exposed by the insulating pillar hole PLH, and then, the cell capacitor CAP and the conductive filling layer CFL may be formed on an inner wall of the expansion space PEX. In a process forming the conductive filling layer CFL in which a conductive layer is formed in the insulating pillar hole PLH and the expansion space PEX and the conductive filling layer CFL is left in the expansion space PEX by removing the conductive layer in the insulating pillar hole PLH, the conductive filling layer CFL may be over-etched, and in this case, the insulating pillar PIL may include the protrusion PILP.

Figure 7:
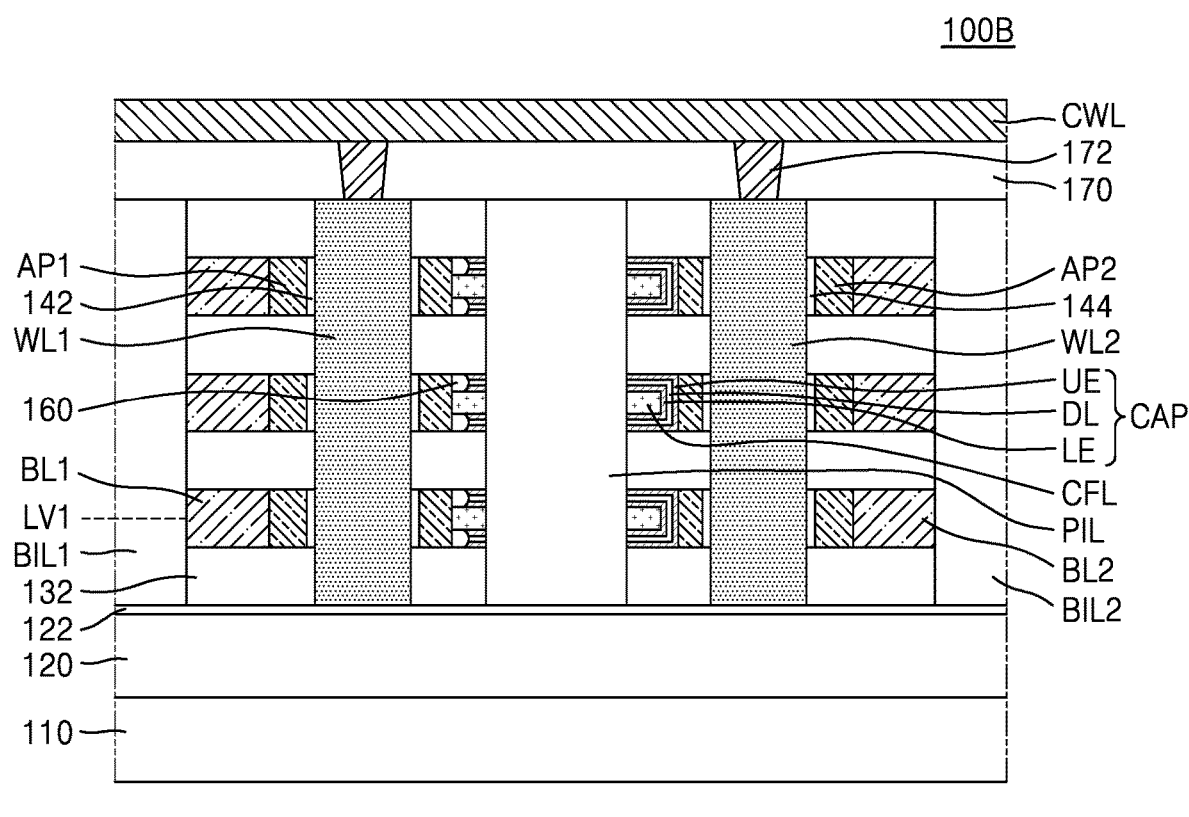
FIG. 7 is a cross-sectional view illustrating a semiconductor memory device according to example embodiments.
Figure 8:
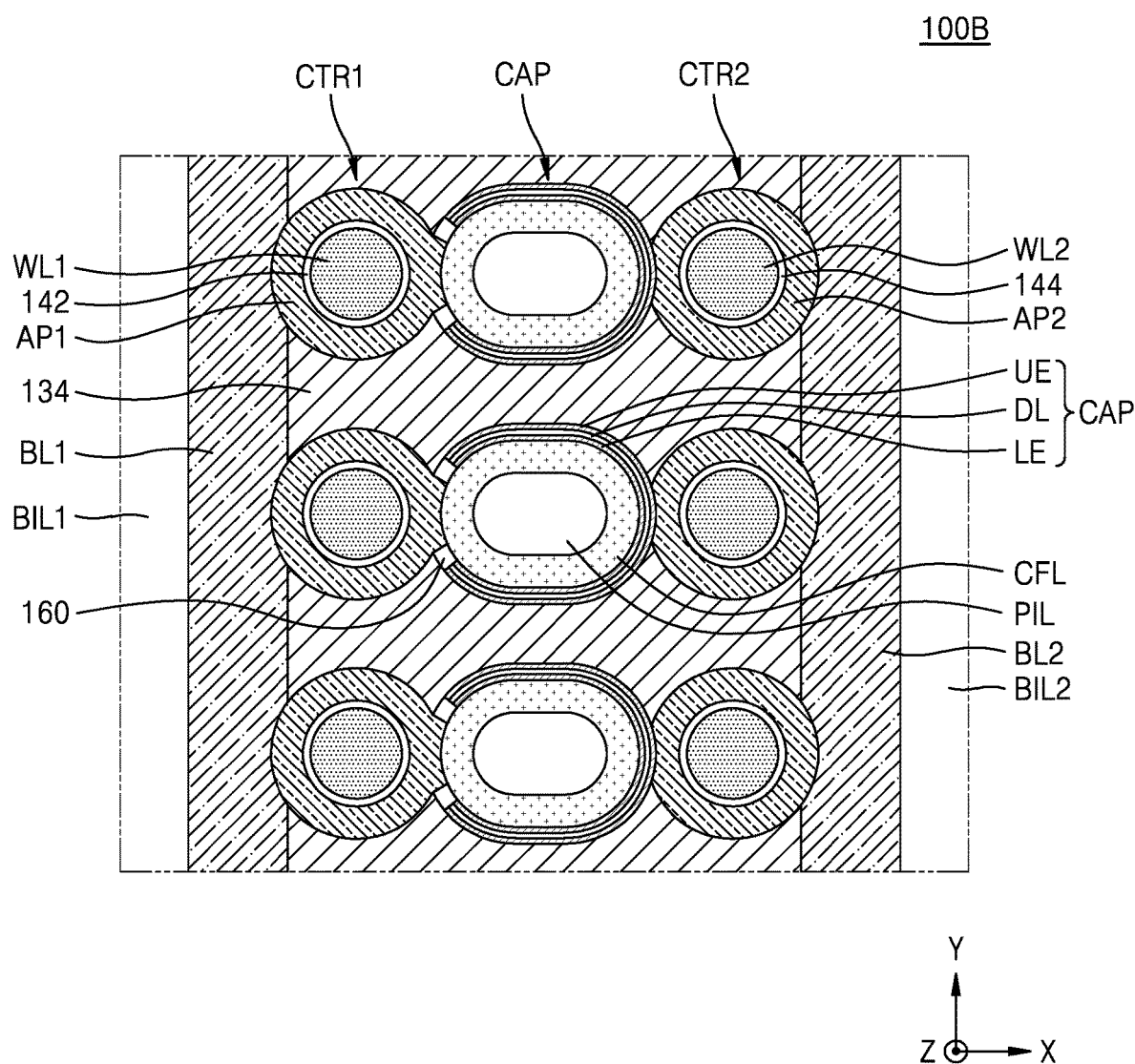
FIG. 8 is a horizontal cross-sectional view taken along a first vertical level LV1 of FIG. 7.

FIG. 7 is a cross-sectional view illustrating a semiconductor memory device 100B according to example embodiments. FIG. 8 is a horizontal cross-sectional view taken along a first vertical level LV1 of FIG. 7.

Referring to FIGS. 7 and 8, the plurality of first semiconductor patterns AP1 and the plurality of second semiconductor patterns AP2 may each include or be formed of an amorphous metal oxide, a polycrystalline metal oxide, a combination of an amorphous metal oxide and a polycrystalline metal oxide, or the like, for example, at least one of an In—Ga oxide (IGO), an In—Zn oxide (IZO), and an In—Ga—Zn oxide (IGZO).

The first semiconductor pattern AP1 may contact the first bit line BL1, and the first contact layer 152 (see FIG. 3) may be omitted between the first semiconductor pattern AP1 and the first bit line BL1. In addition, the second semiconductor pattern AP2 may contact the second bit line BL2, and the second contact layer 154 (see FIG. 3) may be omitted between the second semiconductor pattern AP2 and the second bit line BL2. The upper electrode UE of the cell capacitor CAP may contact the second semiconductor pattern AP2, and the capacitor contact layer 156 (see FIG. 3) may be omitted between the upper electrode UE and the second semiconductor pattern AP2.

According to the above-described example embodiments, the semiconductor patterns (that is, AP1 and AP2), which are based on metal oxides, may be respectively used as channel regions of the first and second cell transistors CTR1 and CTR2, and thus, leakage current may be significantly reduced.

FIGS. 9A to 24B are schematic diagrams illustrating a method of fabricating the semiconductor memory device 100, according to example embodiments. In particular, FIGS. 9A, 10A, 11A, 12A, 13A, 14A, 15A, 16A, 17A, 18A, 19A, 20A, 21A, 22A, 23A, and 24A are cross-sectional views taken along a line A1-A1' of FIG. 2, and FIGS. 9B, 10B, 11B, 12B, 13B, 14B, 15B, 16B, 17B, 18B, 19B, 20B, 21B, 22B, 23B, and 24B are horizontal cross-sectional views taken along a first vertical level LV1 of FIG. 3.

Figure 9A:
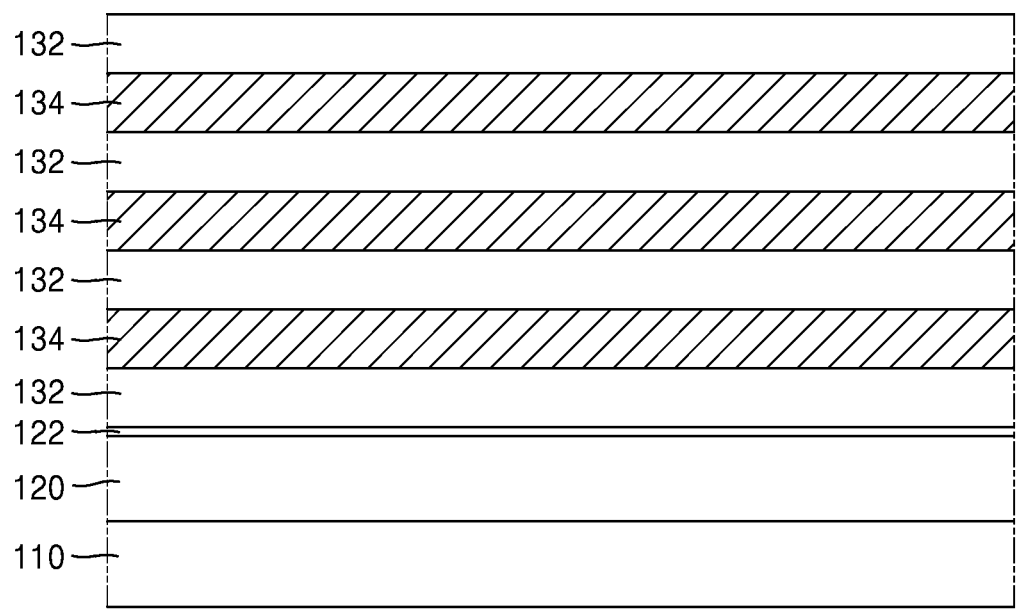
Figure 9B:
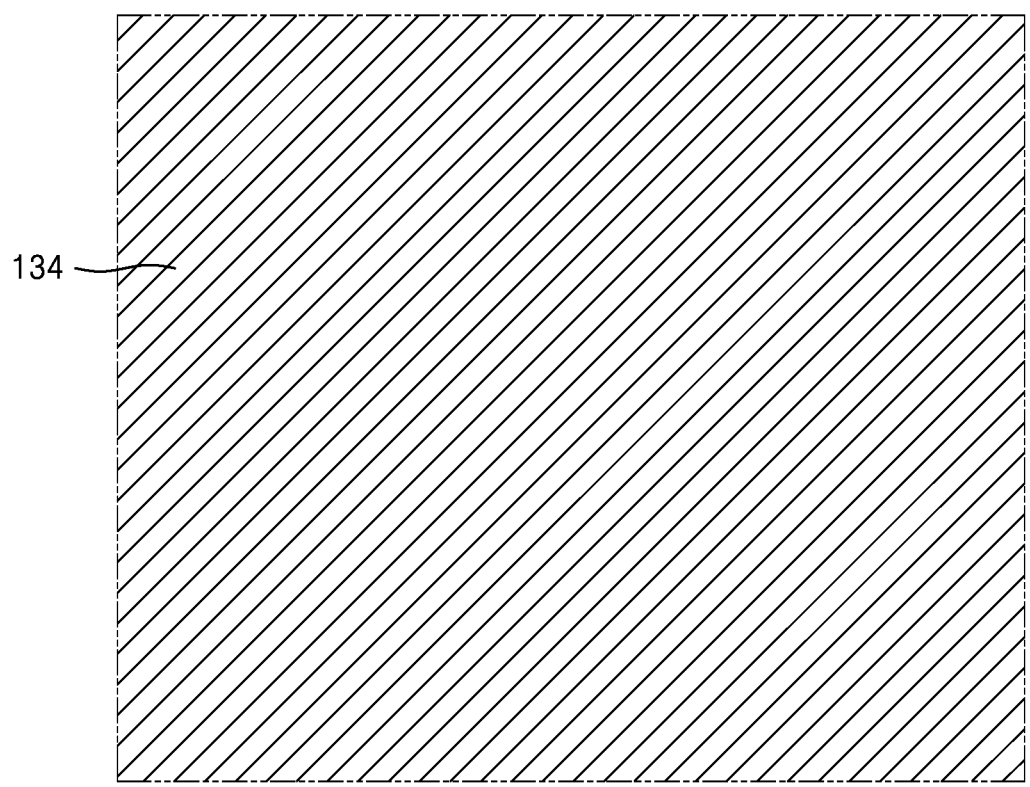

Referring to FIGS. 9A and 9B, the lower structure 120 and the etch stop layer 122 may be formed on the substrate 110. The plurality of mold insulating layers 132 and the plurality of sacrificial insulating layers 134 may be alternately and sequentially formed on the etch stop layer 122.

The plurality of mold insulating layers 132 and the plurality of sacrificial insulating layers 134 may be formed by a chemical vapor deposition (CVD) process, a plasma enhanced CVD (PECVD) process, or an atomic layer deposition (ALD) process. In example embodiments, the plurality of mold insulating layers 132 and the plurality of sacrificial insulating layers 134 may be respectively formed of materials having etch selectivity with respect to each other. For example, the plurality of mold insulating layers 132 may be formed of silicon oxide, and the plurality of sacrificial insulating layers 134 may be formed of silicon nitride. The plurality of mold insulating layers 132 and the plurality of sacrificial insulating layers 134 may each have a thickness of tens of nanometers. For example, each thickness of the molding insulating layers 132 and the sacrificial insulating layers 134 in the vertical direction Z may be between 10 nanometers and 90 nanometers.

Figure 10B:
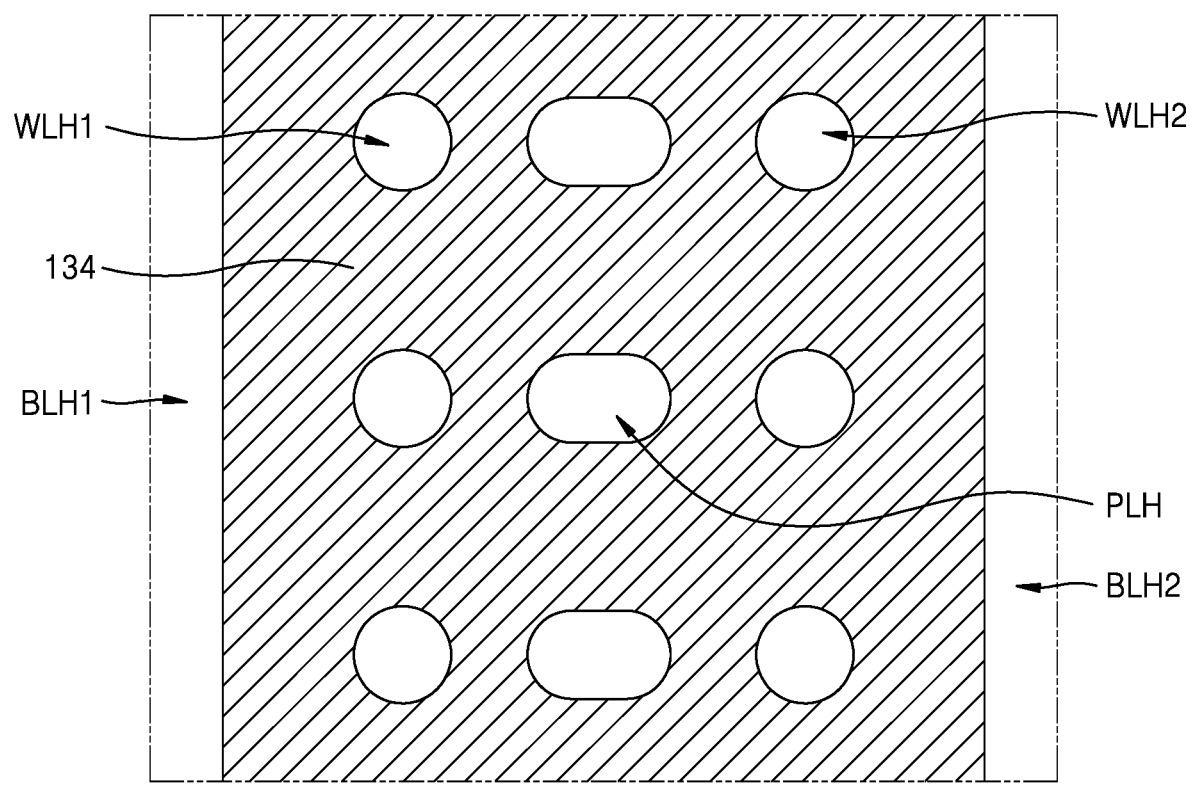

Referring to FIGS. 10A and 10B, a mask pattern (not shown) may be formed on the plurality of mold insulating layers 132 and the plurality of sacrificial insulating layers 134, and the first word line hole WLH1, the second word line hole WLH2, a first bit line hole BLH1, a second bit line hole BLH2, and the insulating pillar hole PLH may be formed by partially removing the plurality of mold insulating layers 132 and the plurality of sacrificial insulating layers 134 by using the mask pattern as an etching mask.

In example embodiments, a top surface of the etch stop layer 122 may be exposed at respective bottoms of the first word line hole WLH1, the second word line hole WLH2, the first bit line hole BLH1, the second bit line hole BLH2, and the insulating pillar hole PLH.

In example embodiments, the first word line hole WLH1, the second word line hole WLH2, and the insulating pillar hole PLH may each have a horizontal cross-section having a circular or elliptical shape. A plurality of first word line holes WLH1 may be formed to be spaced apart from each other in the second horizontal direction (Y direction) and may extend in the vertical direction (Z direction). For example, each of the first word line holes WLH1 may extend vertically. A plurality of second word line holes WLH2 may be formed to be spaced apart from each other in the second horizontal direction (Y direction) and may extend in the vertical direction (Z direction). For example, each of the second word line holes WLH2 may extend vertically. A plurality of insulating pillar holes PLH may be formed to be spaced apart from each other in the second horizontal direction (Y direction) and may extend in the vertical direction (Z direction). For example, each of the pillar holes PLH may extend vertically. The first bit line hole BLH1 may extend in the second horizontal direction (Y direction), and the second bit line hole BLH2 may extend in the second horizontal direction (Y direction).

For example, although each of the first word line hole WLH1, the second word line hole WLH2, the first bit line hole BLH1, the second bit line hole BLH2, and the insulating pillar hole PLH is shown as having an equal horizontal width throughout the total height thereof, unlike this, each of the first word line hole WLH1, the second word line hole WLH2, the first bit line hole BLH1, the second bit line hole BLH2, and the insulating pillar hole PLH may have a tapered shape having a decreasing horizontal width toward the substrate 110, e.g., in a direction approaching the substrate 110.

Figure 11B:
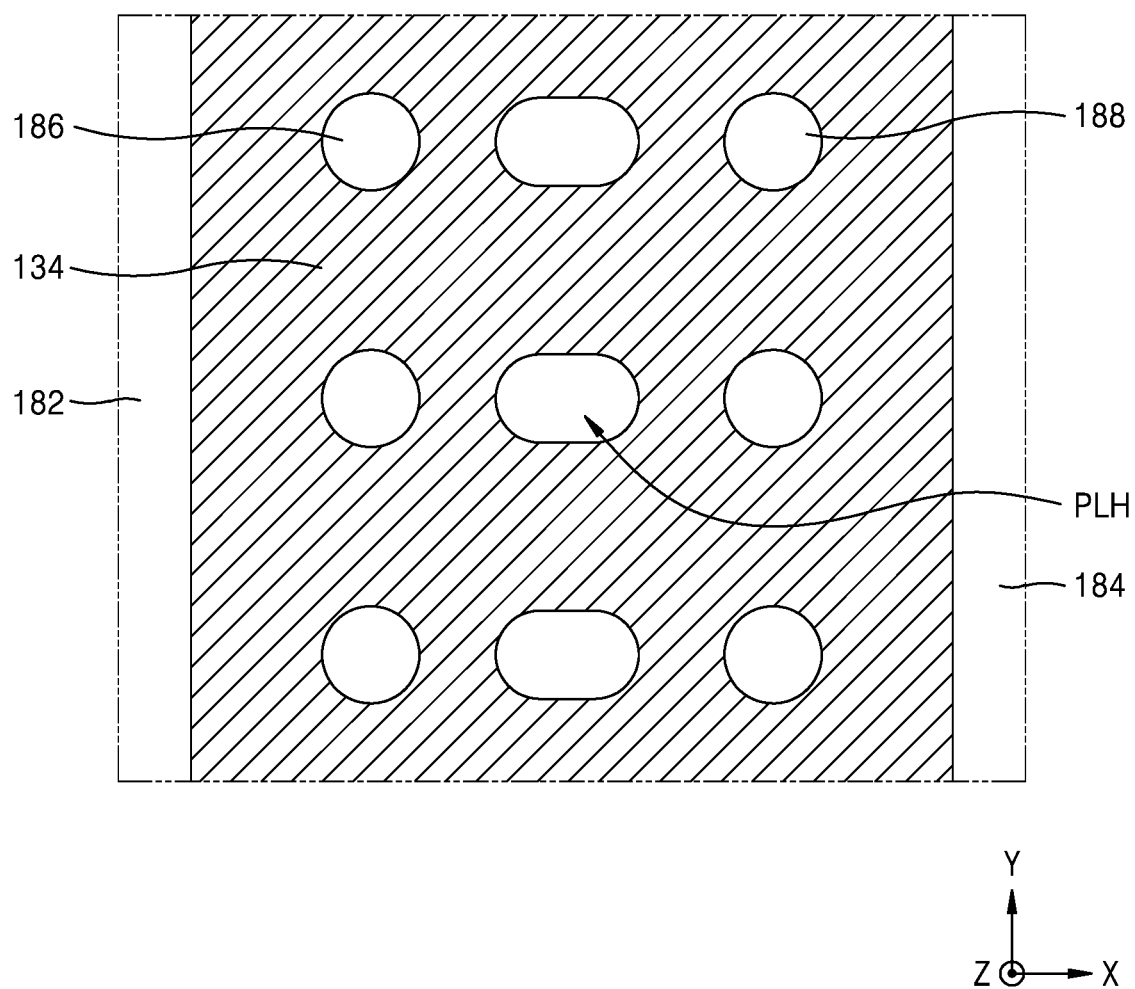

Referring to FIGS. 11A and 11B, sacrificial layers (for example, first, second, third, and fourth sacrificial layers 182, 184, 186, and 188) may be formed to fill the first word line hole WLH1, the second word line hole WLH2, the first bit line hole BLH1, and the second bit line hole BLH2 and not to fill the insulating pillar hole PLH. Here, first and second sacrificial layers 182 and 184 respectively fill the first bit line hole BLH1 and the second bit line hole BLH2, and third and fourth sacrificial layers 186 and 188 respectively fill the first word line hole WLH1 and the second word line hole WLH2.

For example, each of the first to fourth sacrificial layers 182, 184, 186, and 188 may include or be formed of a material having etch selectivity with respect to the mold insulating layer 132 and the sacrificial insulting layers 134. For example, each of the first to fourth sacrificial layers 182, 184, 186, and 188 may include or be formed of polysilicon or a carbon-containing material.

Figure 12A:
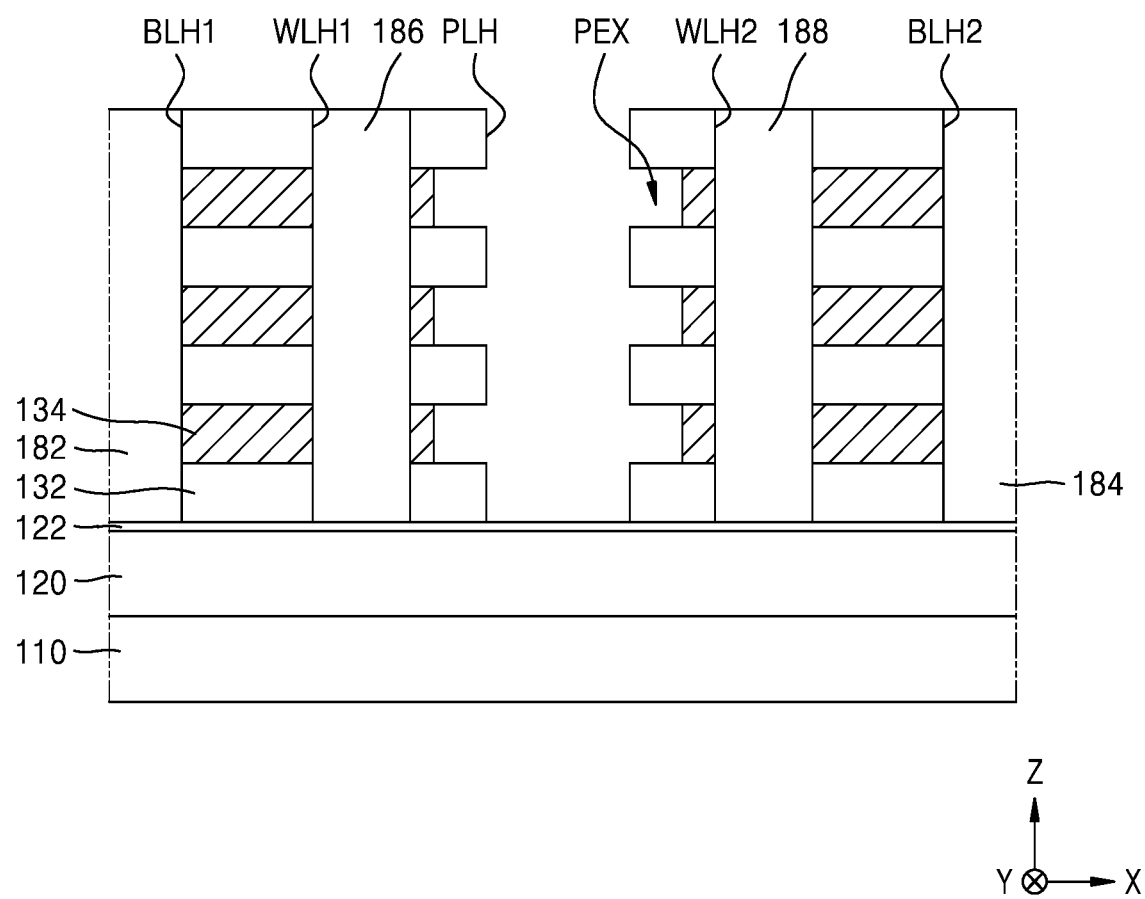
Figure 12B:
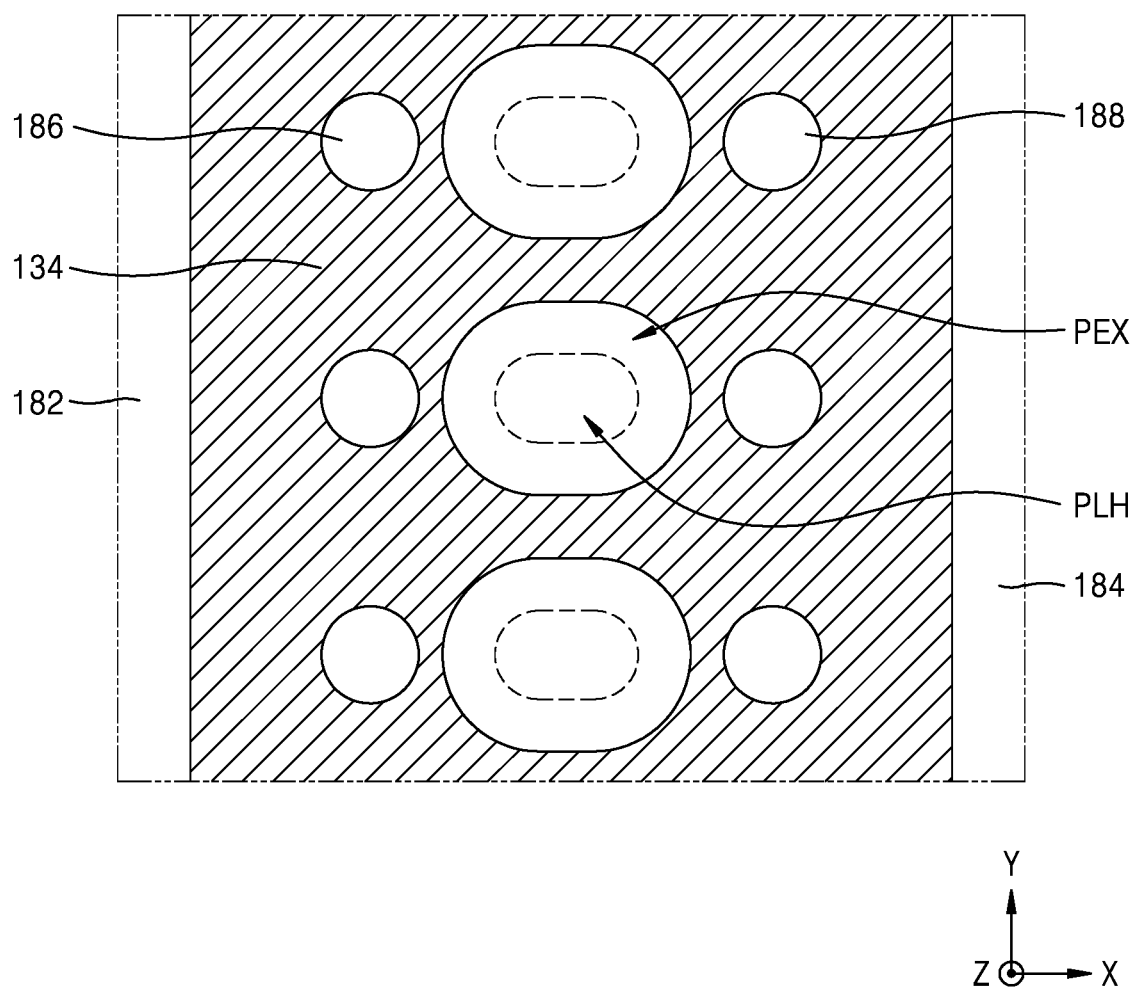

Referring to FIGS. 12A and 12B, the expansion space PEX, which communicates with the insulating pillar hole PLH, may be formed by removing a portion of the sacrificial insulating layer 134, which is exposed by the insulating pillar hole PLH. The expansion space PEX may be formed by removing a portion of the sacrificial insulating layer 134, which is adjacent to the insulating pillar hole PLH, such that the third sacrificial layer 186 filling the first word line hole WLH1 and the fourth sacrificial layer 188 filling the second word line hole WLH2 are not exposed.

Because the expansion space PEX is formed by removing the portion of the sacrificial insulating layer 134, which is exposed by the insulating pillar hole PLH, the expansion space PEX may have a substantially constant/equal width in a horizontal direction from the insulating pillar hole PLH. In some embodiments, the expansion space PEX may have a width of tens of nanometers in the horizontal direction from the insulating pillar hole PLH. For example, the width of the expansion space PEX in the first horizontal direction X and/or in the second horizontal direction Y may be between 10 nanometers and 90 nanometers. The height of the expansion space PEX may be the same as the height of the sacrificial insulating layer 134. In some embodiments, the expansion space PEX may have a height of tens of nanometers in the vertical direction (Z direction). For example, the height of the expansion space PEX in the vertical direction Z may be between 10 nanometers and 90 nanometers.

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

Figure 13A:
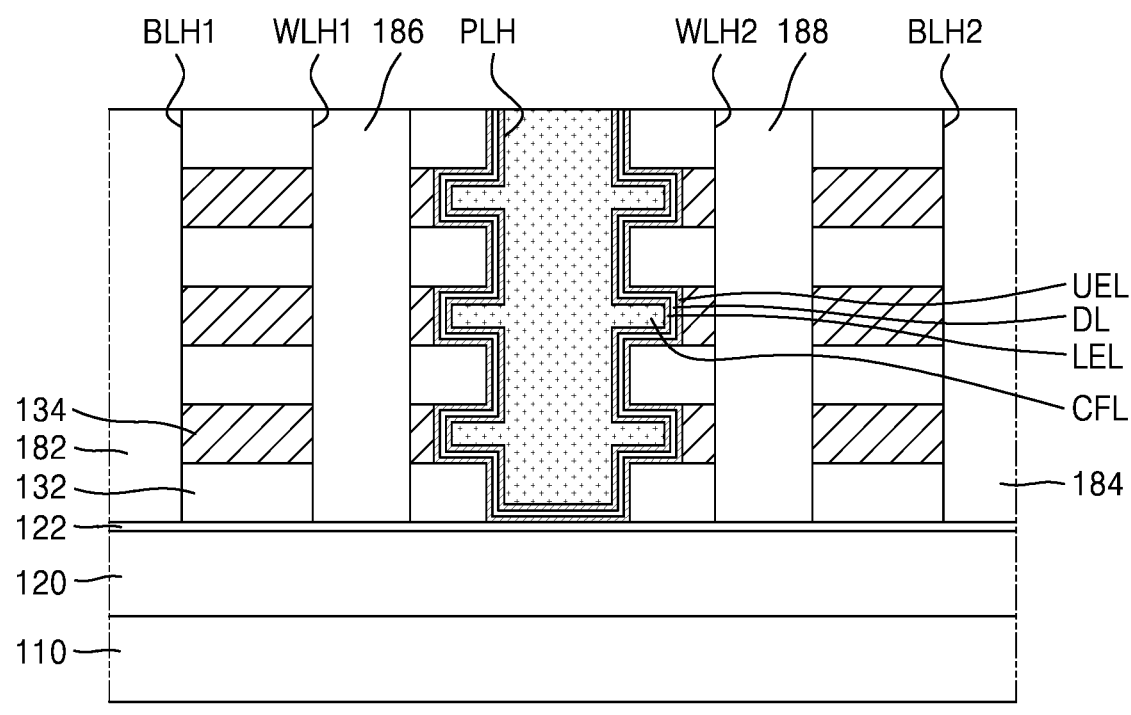
Figure 13A:
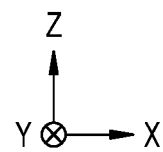
Figure 13B:
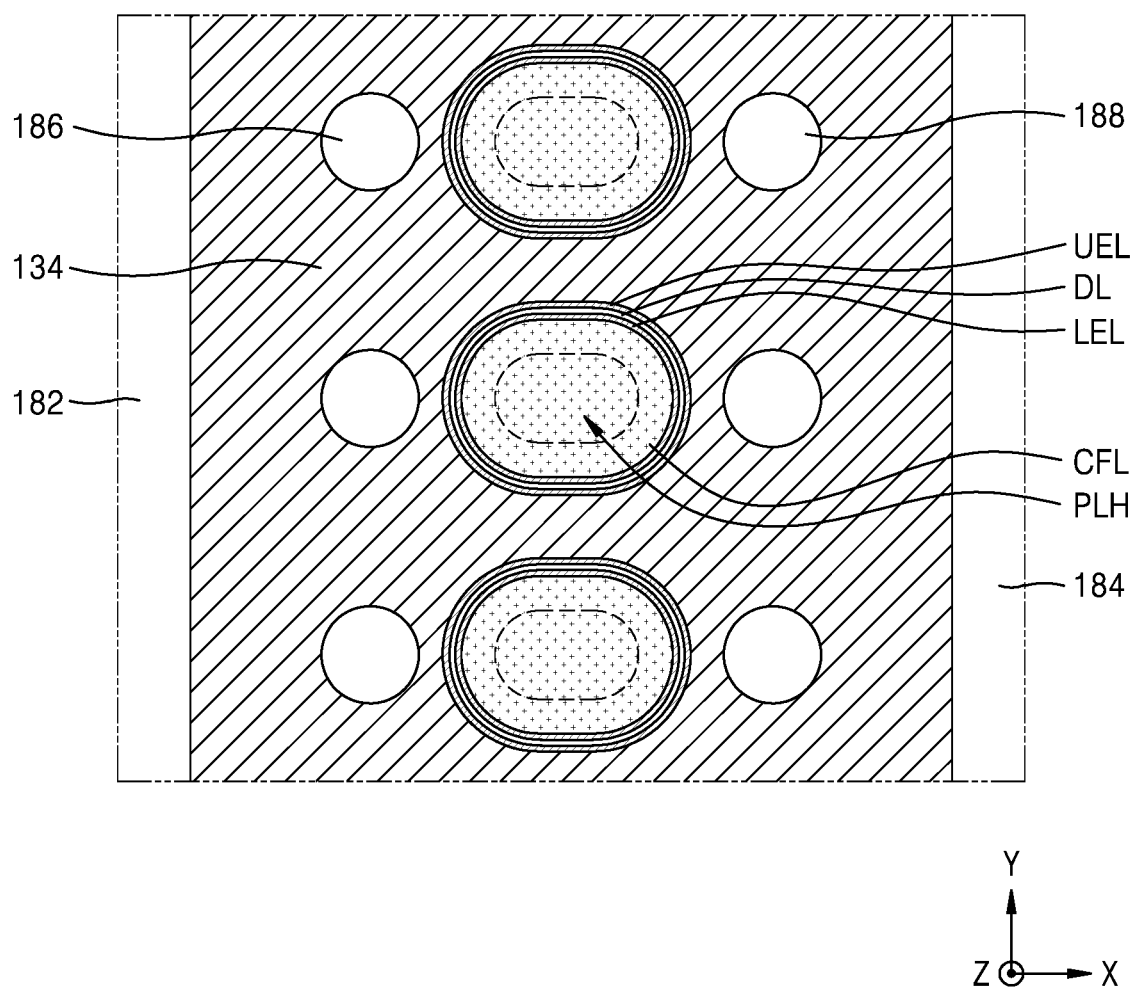

Referring to FIGS. 13A and 13B, an upper electrode layer UEL, the capacitor dielectric film DL, and a lower electrode layer LEL may be sequentially formed in the stated order in the insulating pillar hole PLH and the expansion space PEX.

In example embodiments, the upper electrode layer UEL, the capacitor dielectric film DL, and the lower electrode layer LEL may be conformally arranged on the inner wall of the expansion space PEX and may not completely fill the inside of the expansion space PEX.

Next, the conductive filling layer CFL may be formed on the lower electrode layer LEL. In example embodiments, the conductive filling layer CFL may be formed of polysilicon doped with n-type impurities.

Figure 14A:
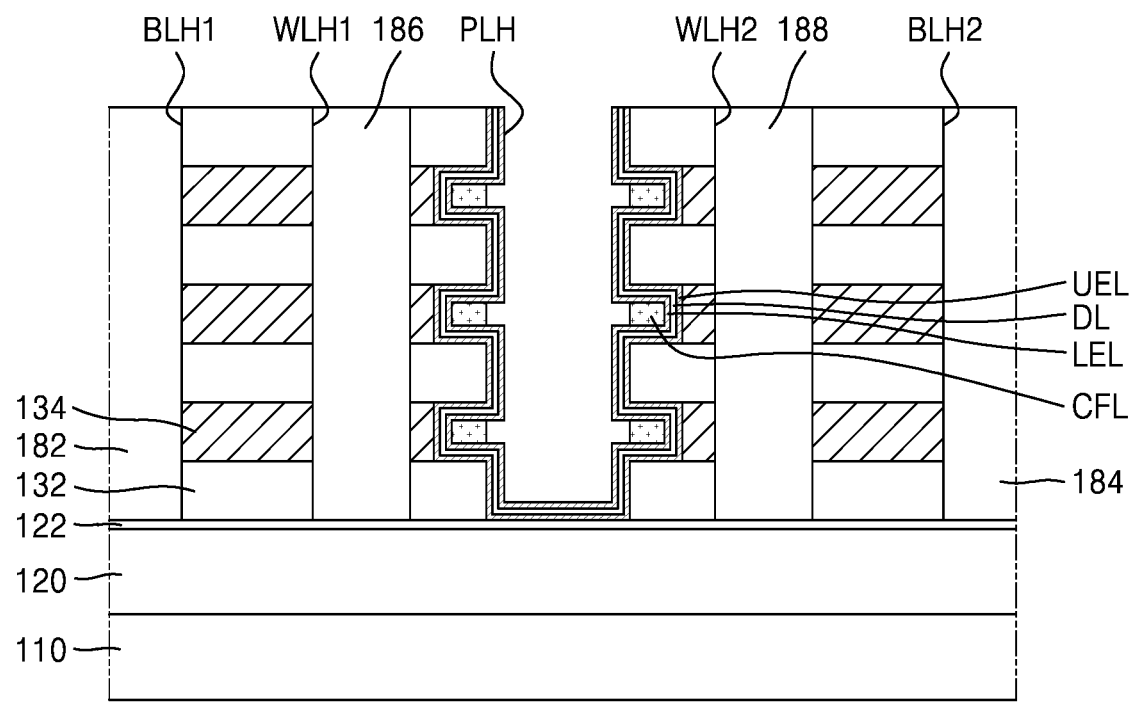
Figure 14B:
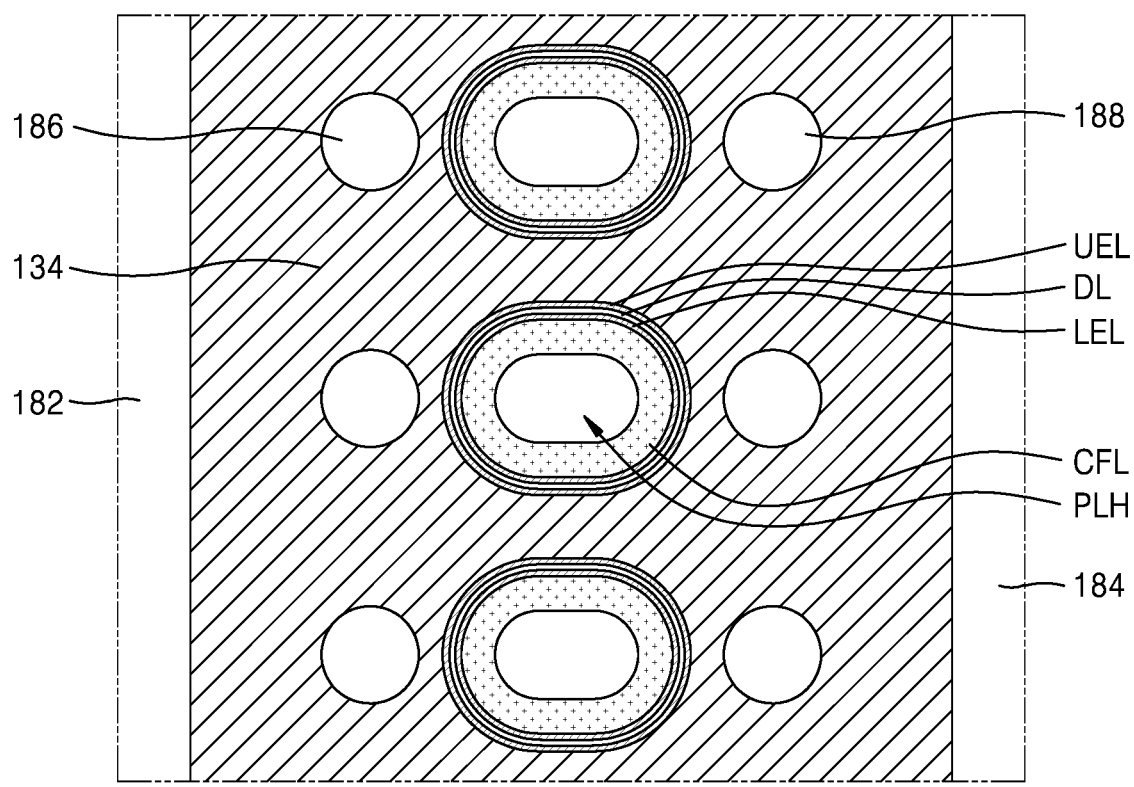

Referring to FIGS. 14A and 14B, a portion of the conductive filling layer CFL may be left in the expansion space PEX by removing a portion of the conductive filling layer CFL in the insulating pillar hole PLH.

Figure 15B:
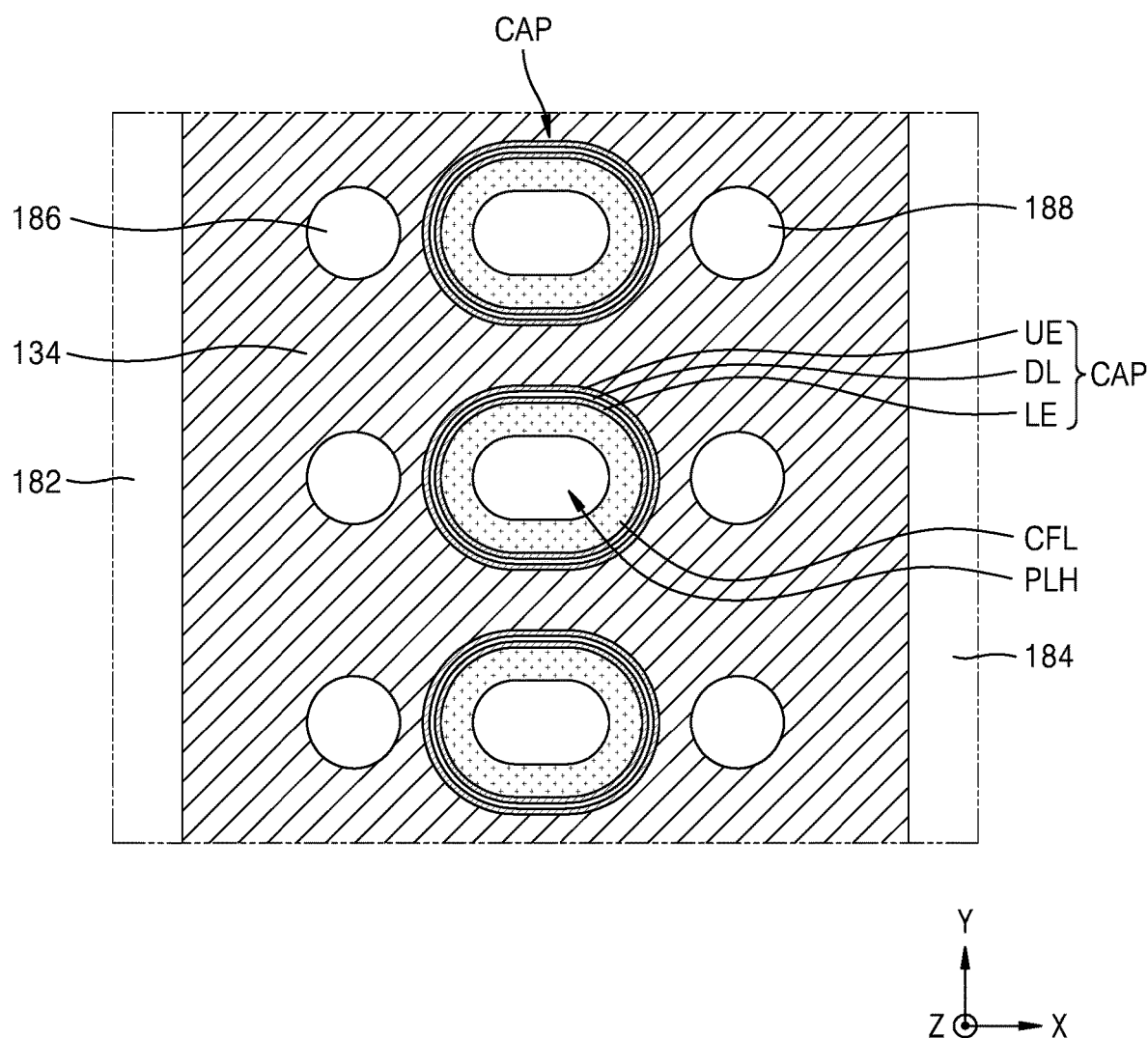

Referring to FIGS. 15A and 15B, the upper electrode UE, the capacitor dielectric film DL, and the lower electrode LE may be left in the expansion space PEX by removing respective portions of the upper electrode layer UEL, the capacitor dielectric film DL, and the lower electrode layer LEL, which are arranged on the inner wall of the insulating pillar hole PLH.

In example embodiments, a plurality of cell capacitors CAP may be arranged on an inner wall of one insulating pillar hole PLH. For example, the cell capacitor CAP and the conductive filling layer CFL may be arranged in the expansion space PEX, e.g., in a plan view, and may have a ring shape, e.g., in a horizontal cross-sectional view. The conductive filling layer CFL may have a ring shape, e.g., in a horizontal cross-sectional view.

Figure 16B:
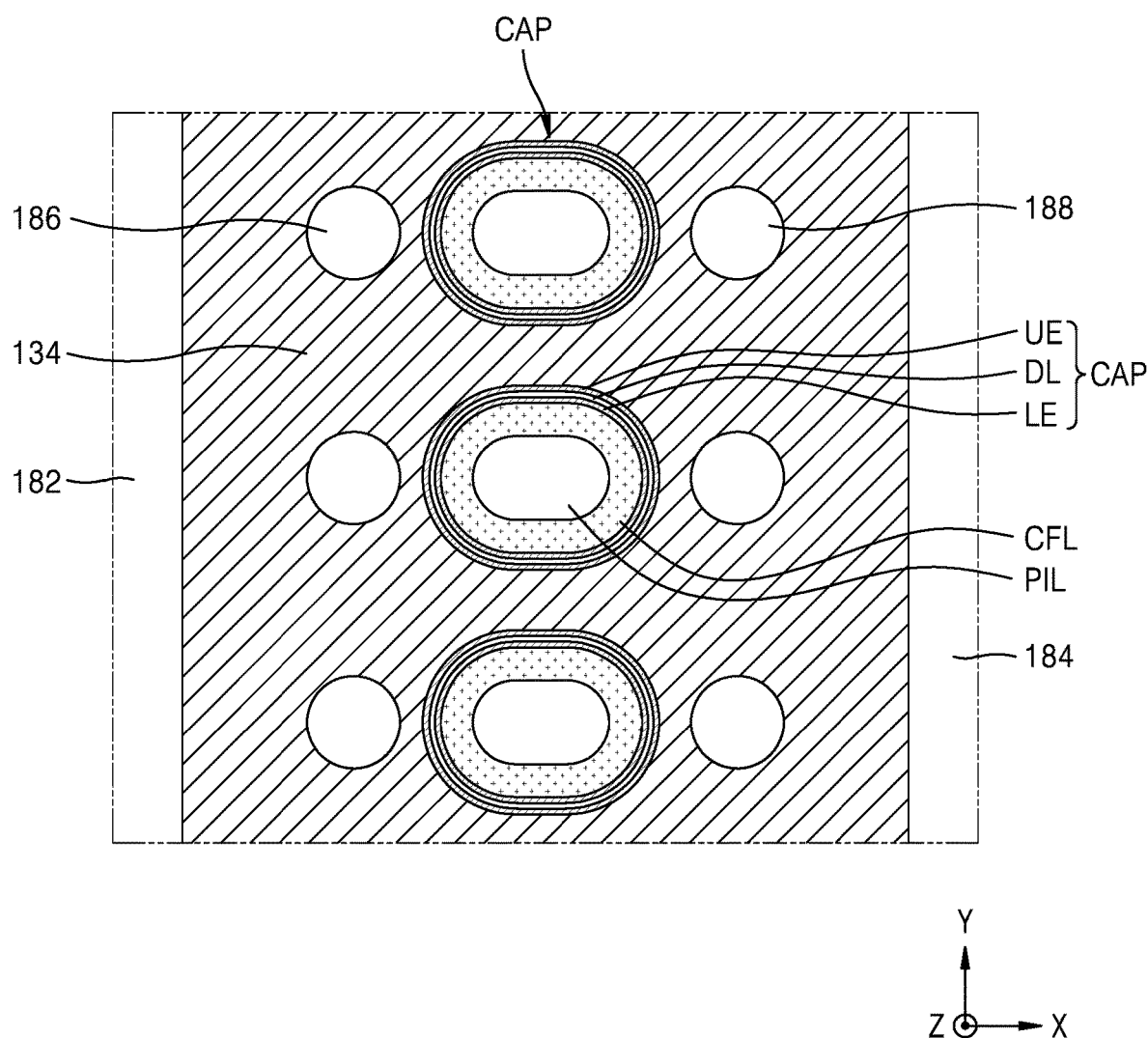

Referring to FIGS. 16A and 16B, the insulating pillar PIL may be formed by filling the inside of the insulating pillar hole PLH with an insulating material. The insulating pillar PIL may be surrounded by the cell capacitor CAP and the conductive filling layer CFL.

In the above-described removal process of the conductive filling layer CFL, when the conductive filling layer CFL is over-etched, the conductive filling layer CFL may have a recessed sidewall, and the insulating pillar PIL may have the protrusion PILP surrounded by the recessed sidewall of the insulating pillar PIL. In this case, the semiconductor memory device 100A described with reference to FIG. 6 may be formed.

Figure 17A:
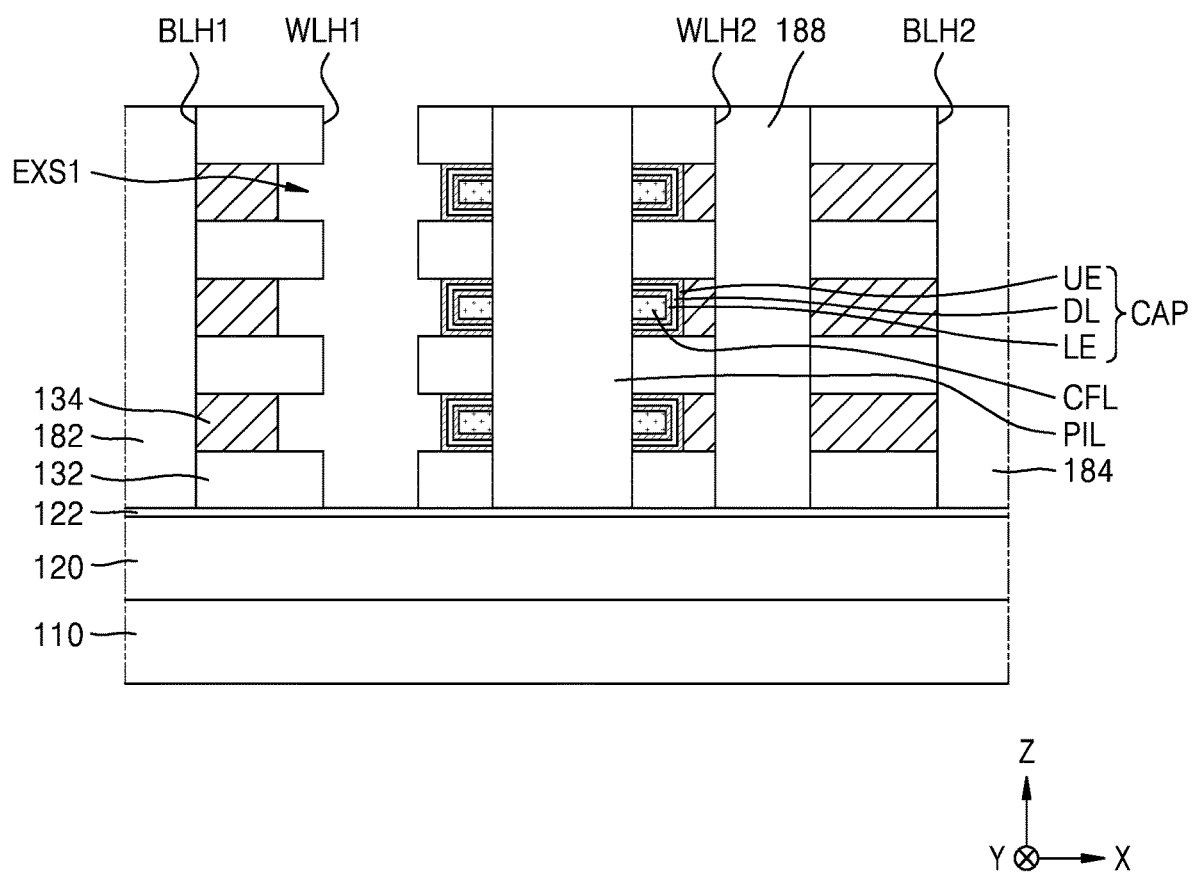
Figure 17B:
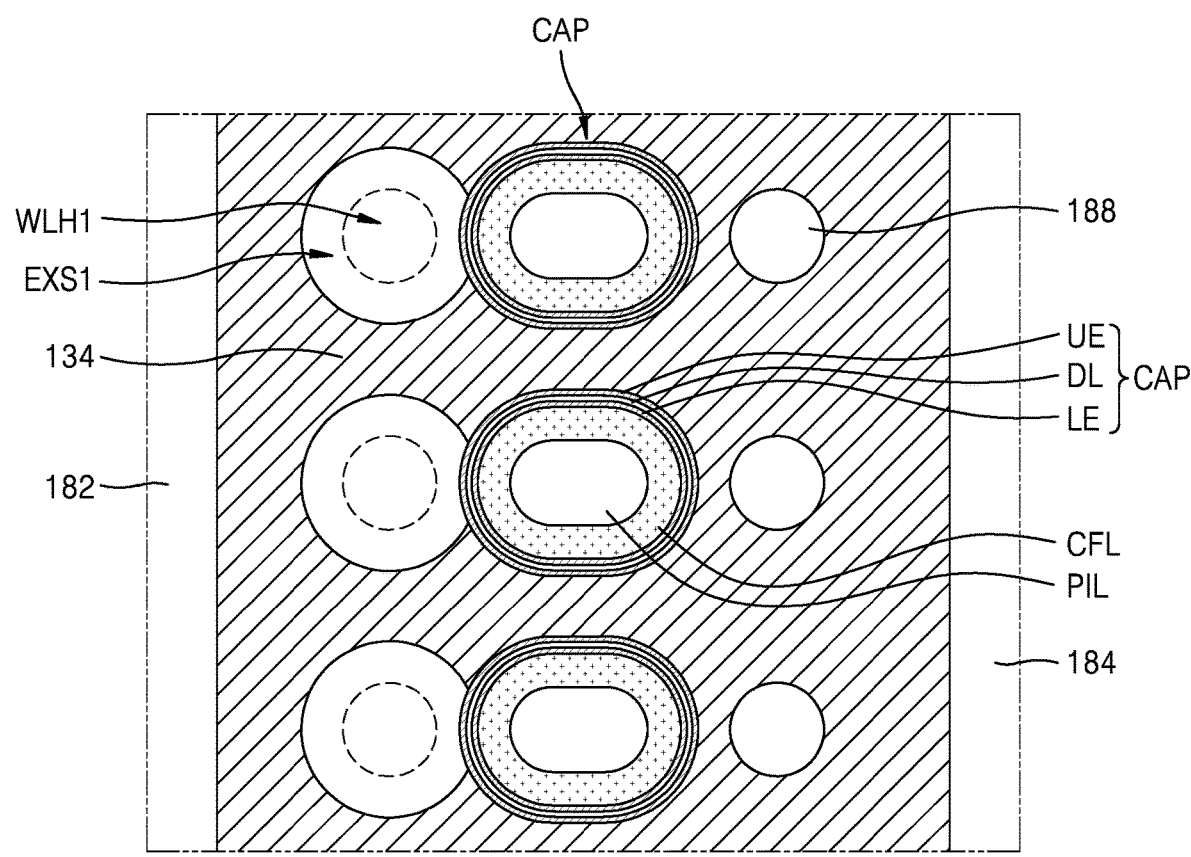

Referring to FIGS. 17A and 17B, the third sacrificial layer 186 may be removed, and the inner wall of the first word line hole WLH1 may be exposed again. A first expansion space EXS1, which communicates with the first word line hole WLH1, may be formed by removing a portion of the sacrificial insulating layer 134, which is exposed by the first word line hole WLH1. The first expansion space EXS1 may be formed by removing a portion of the sacrificial insulating layer 134, which is adjacent to the first word line hole WLH1, such that a portion of the sidewall of the cell capacitor CAP is exposed.

Because the first expansion space EXS1 is formed by removing the portion of the sacrificial insulating layer 134, which is exposed by the first word line hole WLH1, the first expansion space EXS1 may have a substantially constant/equal width in a horizontal direction from the first word line hole WLH1. In some embodiments, the first expansion space EXS1 may have a width of tens of nanometers in the horizontal direction from the first word line hole WLH1. For example, the width of the first expansion space EXS1 in the first horizontal direction X and/or in the second horizontal direction Y may be between 10 nanometers and 90 nanometers. The height of the first expansion space EXS1 may be the same as the height of the sacrificial insulating layer 134. In some embodiments, the first expansion space EXS1 may have a height of tens of nanometers in the vertical direction (Z direction). For example, the height of the first expansion space EXS1 in the vertical direction Z may be between 10 nanometers and 90 nanometers.

Figure 18A:
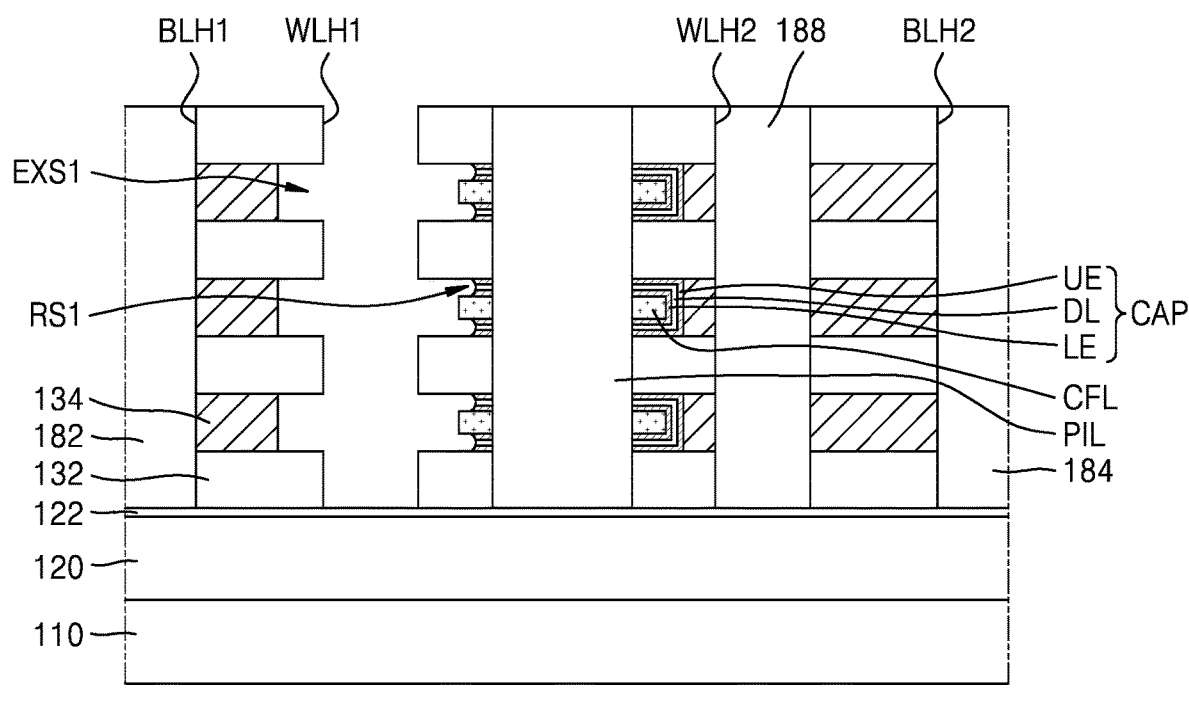
Figure 18B:
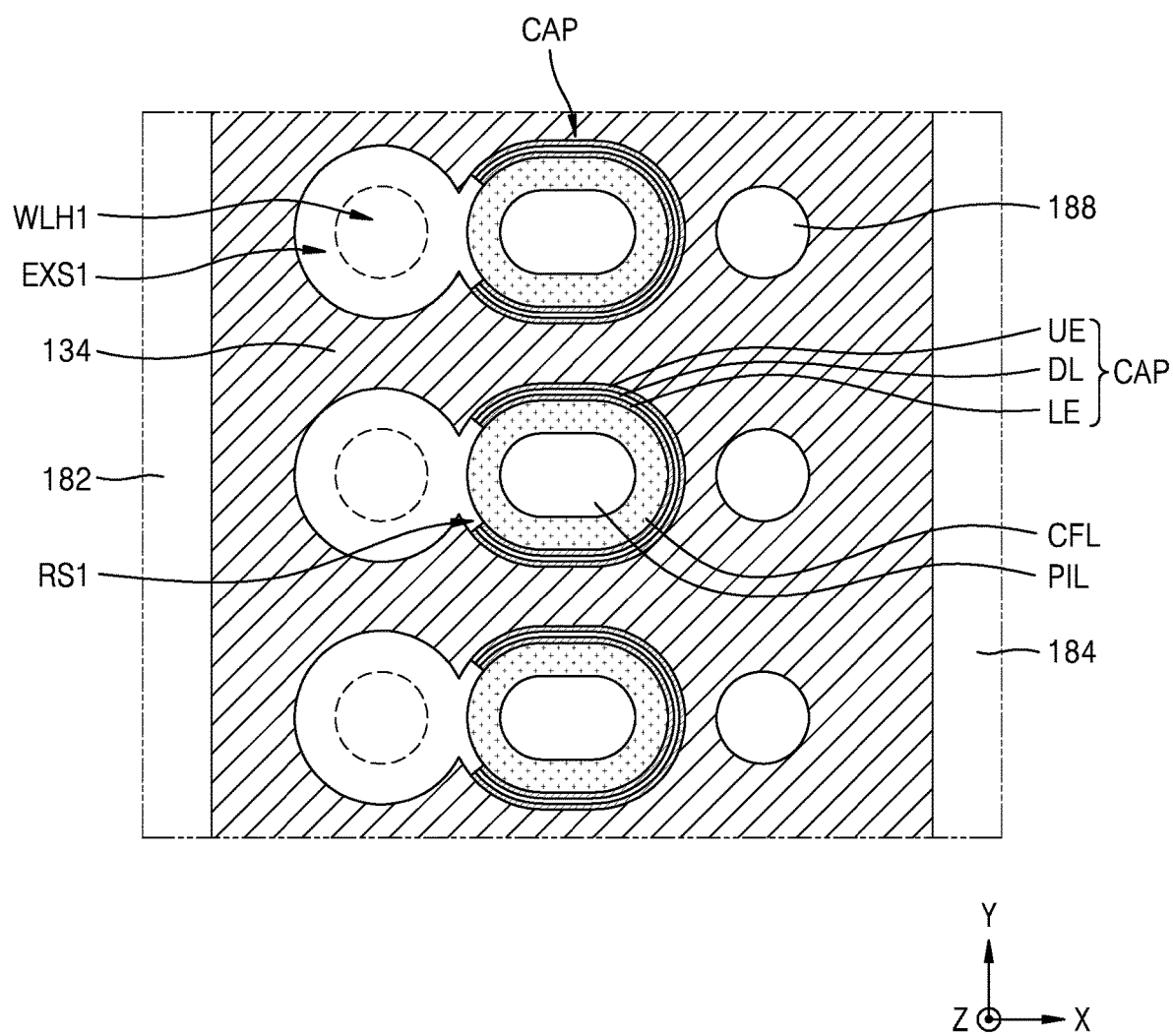

Referring to FIGS. 18A and 18B, the sidewall of the conductive filling layer CFL may be exposed by removing the upper electrode UE, the capacitor dielectric film DL, and the lower electrode LE, which are exposed by the first expansion space EXS1.

In a process of removing the upper electrode UE, the capacitor dielectric film DL, and the lower electrode LE, which are exposed by the first expansion space EXS1, respective portions of the upper electrode UE, the capacitor dielectric film DL, and the lower electrode LE may be removed together, and thus, a recess space RS1 may be further formed in a lateral direction from the first expansion space EXS1. The recess space RS1 may expose the top surface and the bottom surface of the conductive filling layer CFL.

Figure 19A:
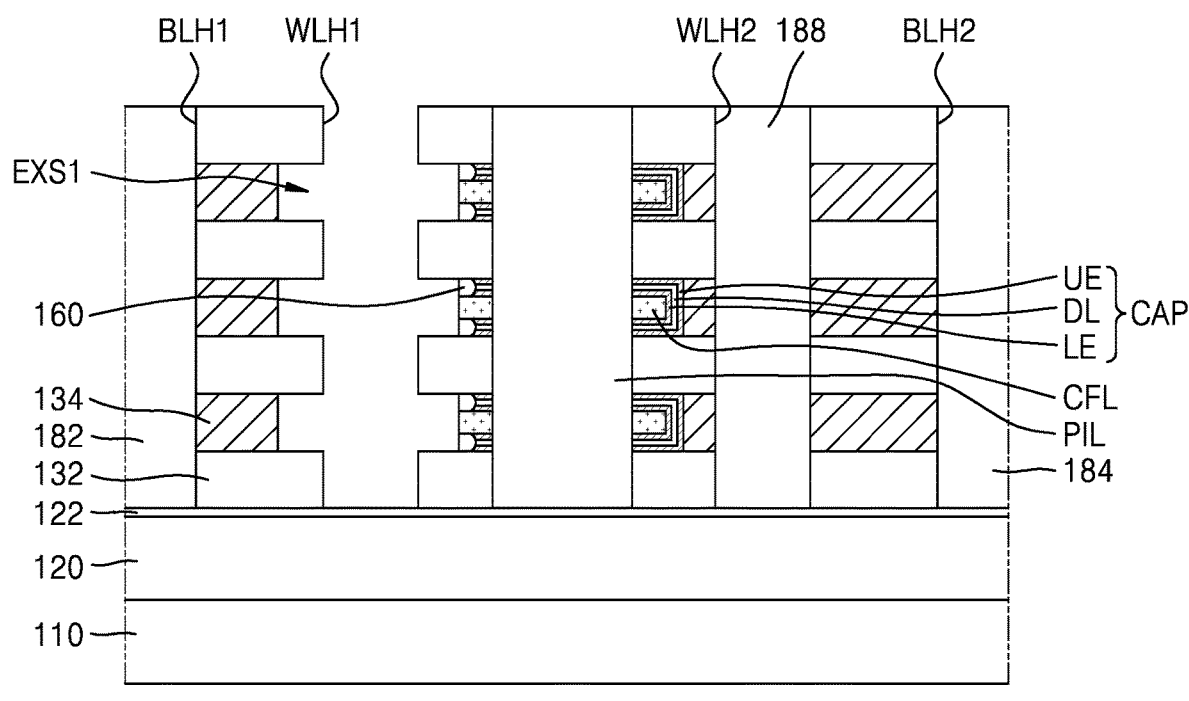
Figure 19B:
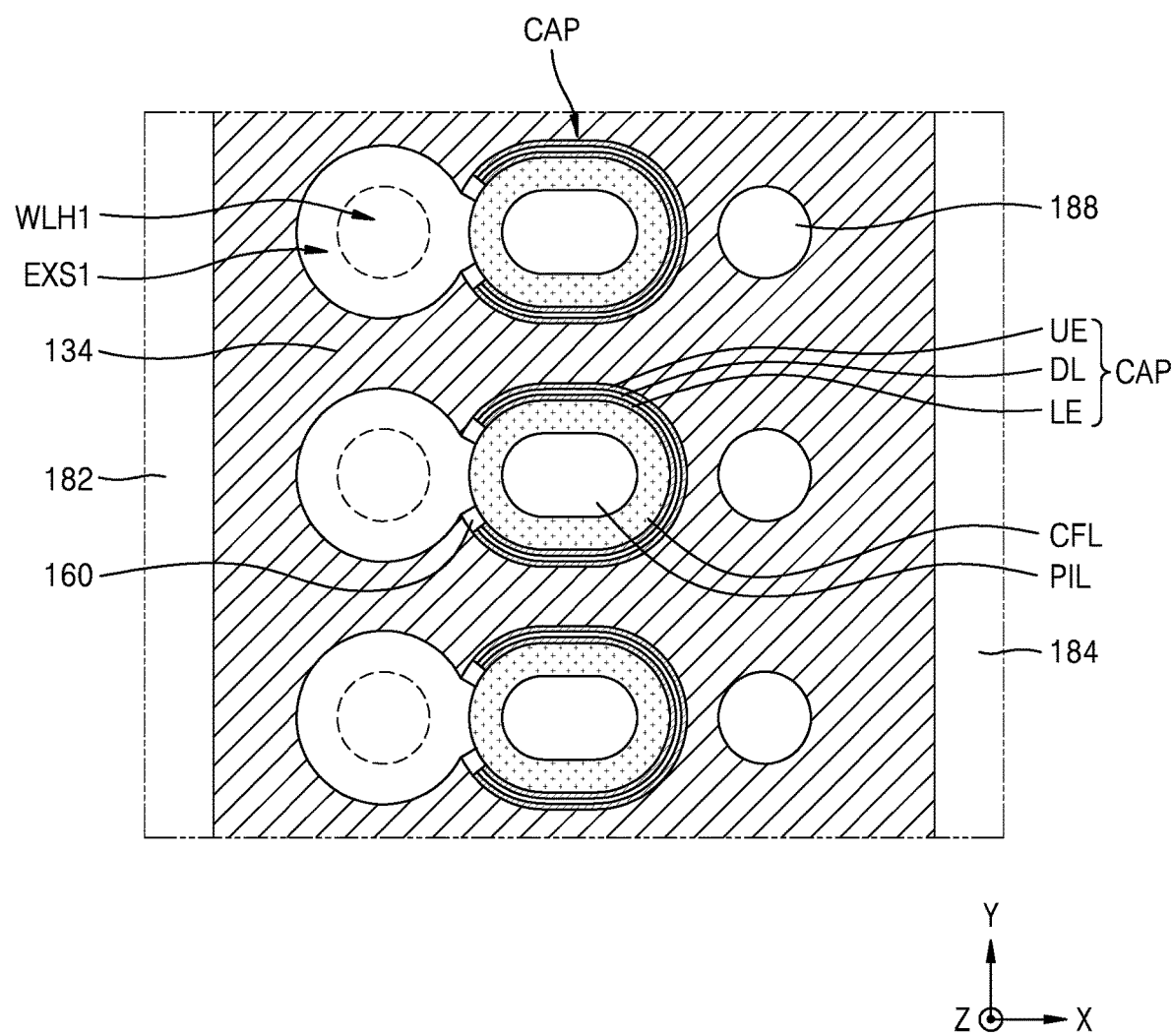

Referring to FIGS. 19A and 19B, an insulating layer (not shown) may be formed on the inner wall of the first word line hole WLH1 to fill the recess space RS1 exposed by the first expansion space EXS1, and a portion of the insulating layer on the respective sidewalls of the first word line hole WLH1 and the first expansion space EXS1 may be removed, whereby the isolation insulating layer 160 may remain in the recess space RS1.

The isolation insulating layer 160 may have an appropriate thickness to completely fill the recess space RS1 and to cause the cell capacitor CAP not to be exposed by the first word line hole WLH1 and the first expansion space EXS1. The sidewall of the conductive filling layer CFL, which is exposed by the first expansion space EXS1, may not be covered by the isolation insulating layer 160.

Figure 20A:
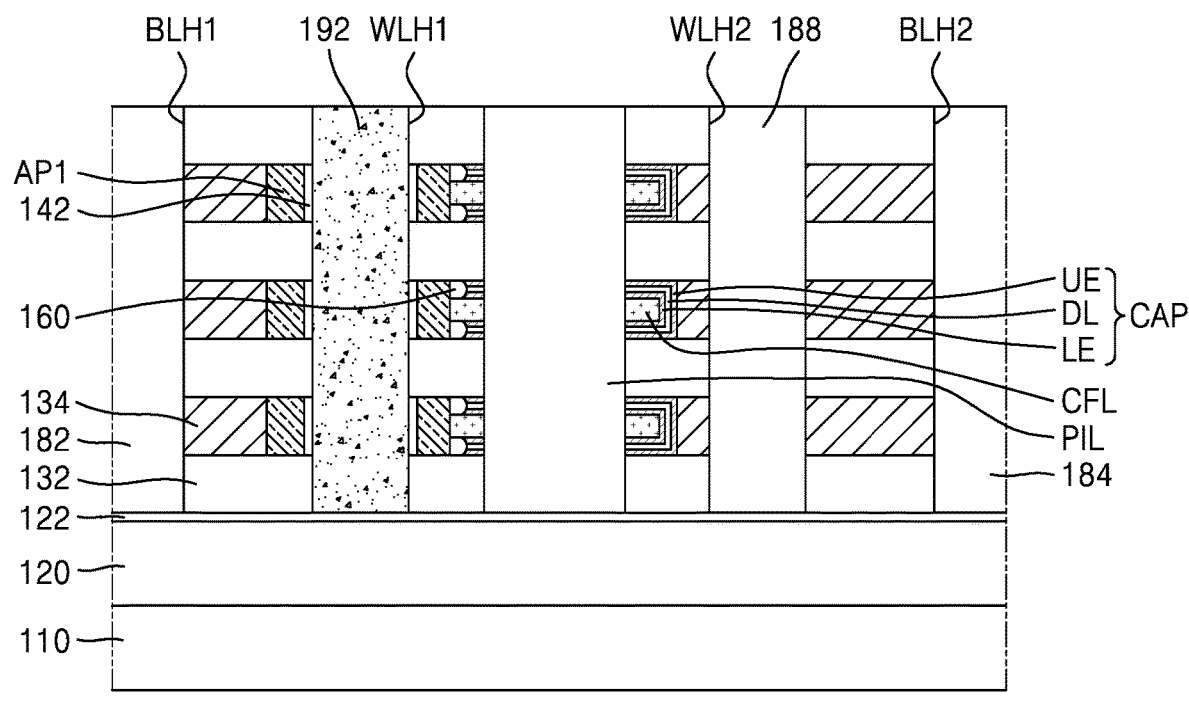
Figure 20B:
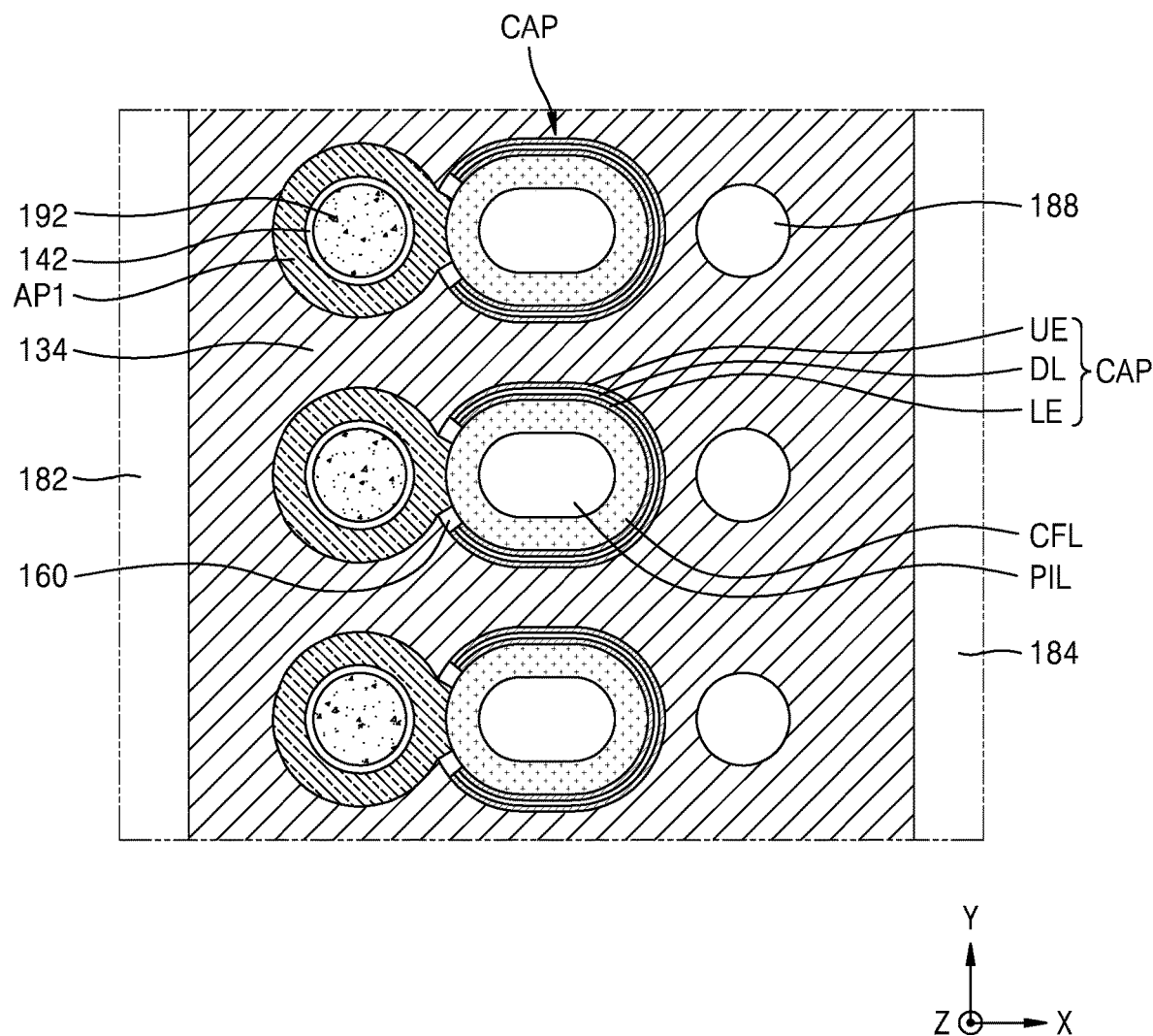

Referring to FIGS. 20A and 20B, the first semiconductor pattern AP1 may be formed on the inner wall of the first expansion space EXS1. In example embodiments, the first semiconductor pattern AP1 may be formed by a CVD process, a PECVD process, or an ALD process.

Next, the first gate insulating layer 142 may be formed on the inner wall of the first semiconductor pattern AP1. The first gate insulating layer 142 may be formed by at least one of a thermal oxidation process, a CVD process, a PECVD process, and an ALD process. In some embodiments, the first gate insulating layer 142 may be formed to cover only the inner wall of the first semiconductor pattern AP1. In some other embodiments, the first gate insulating layer 142 may be formed to cover both the inner wall of the first semiconductor pattern AP1 and the inner wall of the mold insulating layer 132.

Next, a fifth sacrificial layer 192 may be formed to fill the first word line hole WLH1. In some embodiments, the fifth sacrificial layer 192 may be formed of silicon nitride.

Figure 21A:
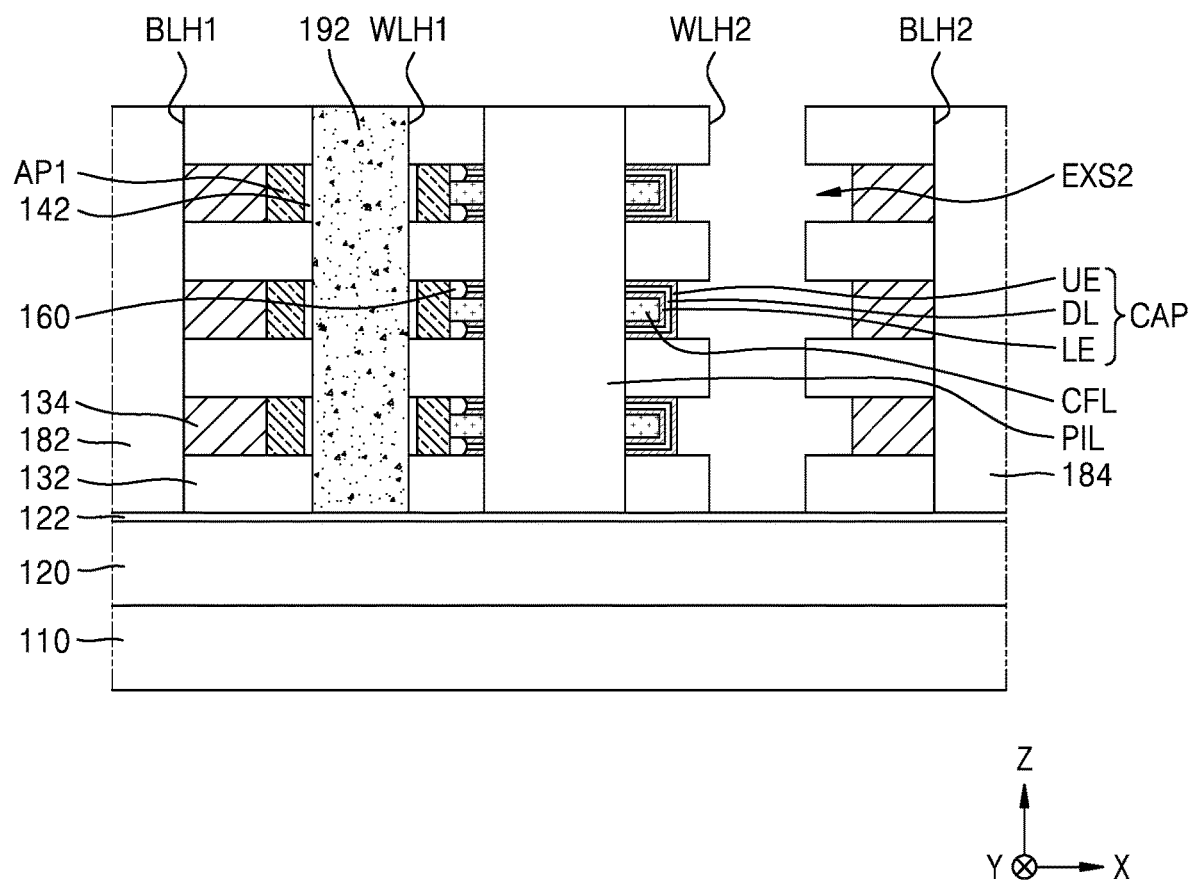
Figure 21B:
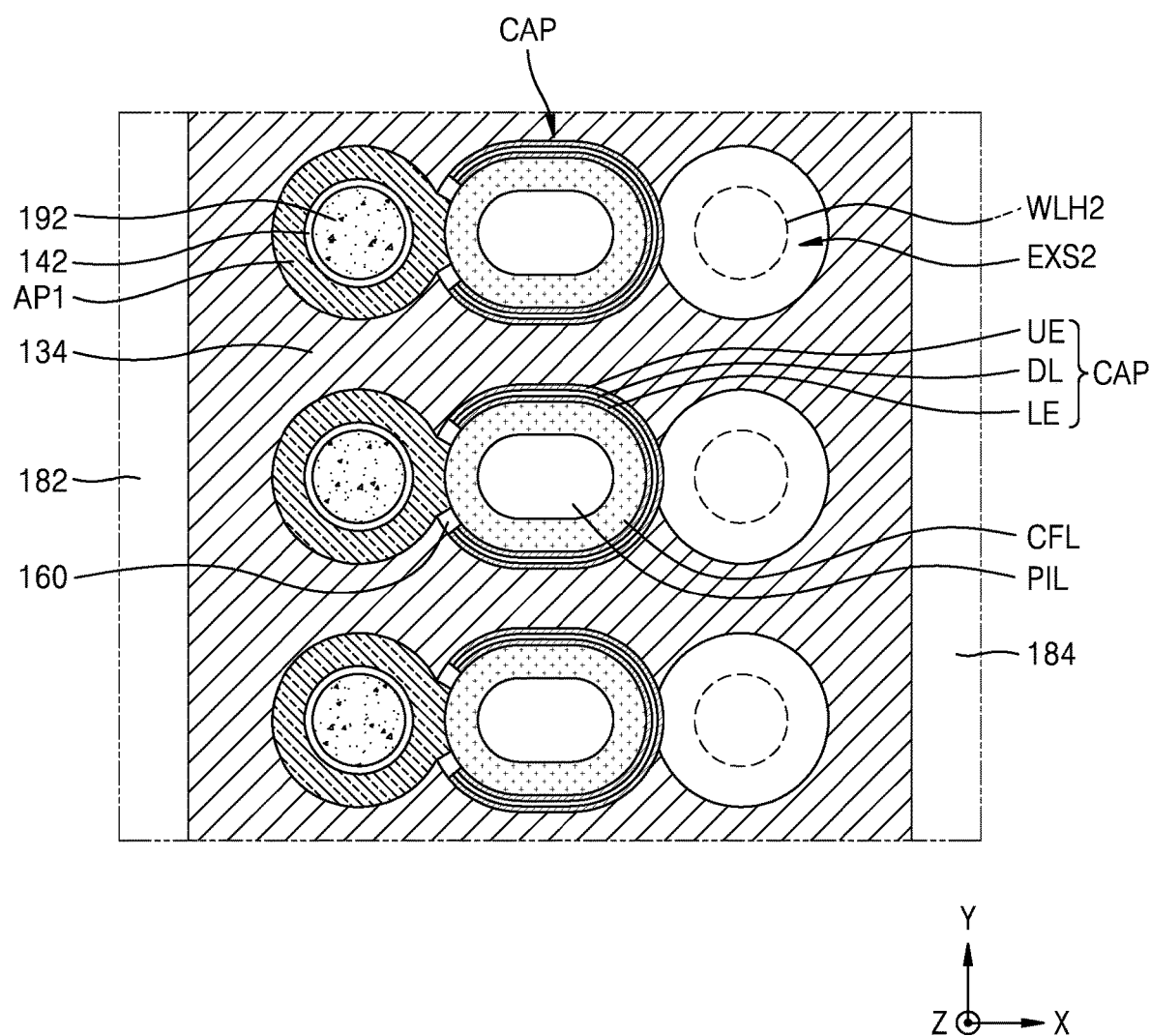

Referring to FIGS. 21A and 21B, the fourth sacrificial layer 188 may be removed, and the inner wall of the second word line hole WLH2 may be exposed again. A second expansion space EXS2, which communicates with the second word line hole WLH2, may be formed by removing a portion of the sacrificial insulating layer 134, which is exposed by the second word line hole WLH2. The second expansion space EXS2 may be formed by removing a portion of the sacrificial insulating layer 134, which is adjacent to the second word line hole WLH2, such that a portion of the sidewall of the cell capacitor CAP is exposed.

Because the second expansion space EXS2 is formed by removing the portion of the sacrificial insulating layer 134, which is exposed by the second word line hole WLH2, the second expansion space EXS2 may have a substantially constant/equal width in a horizontal direction from the second word line hole WLH2. In some embodiments, the second expansion space EXS2 may have a width of tens of nanometers in the horizontal direction from the second word line hole WLH2. For example, the width of the second expansion space EXS2 in the first horizontal direction X and/or in the second horizontal direction Y may be between 10 nanometers and 90 nanometers. The height of the second expansion space EXS2 may be the same as the height of the sacrificial insulating layer 134. In some embodiments, the second expansion space EXS2 may have a height of tens of nanometers in the vertical direction (Z direction). For example the height of the second expansion space EXS2 in the vertical direction Z may be between 10 nanometers and 90 nanometers.

Figure 22A:
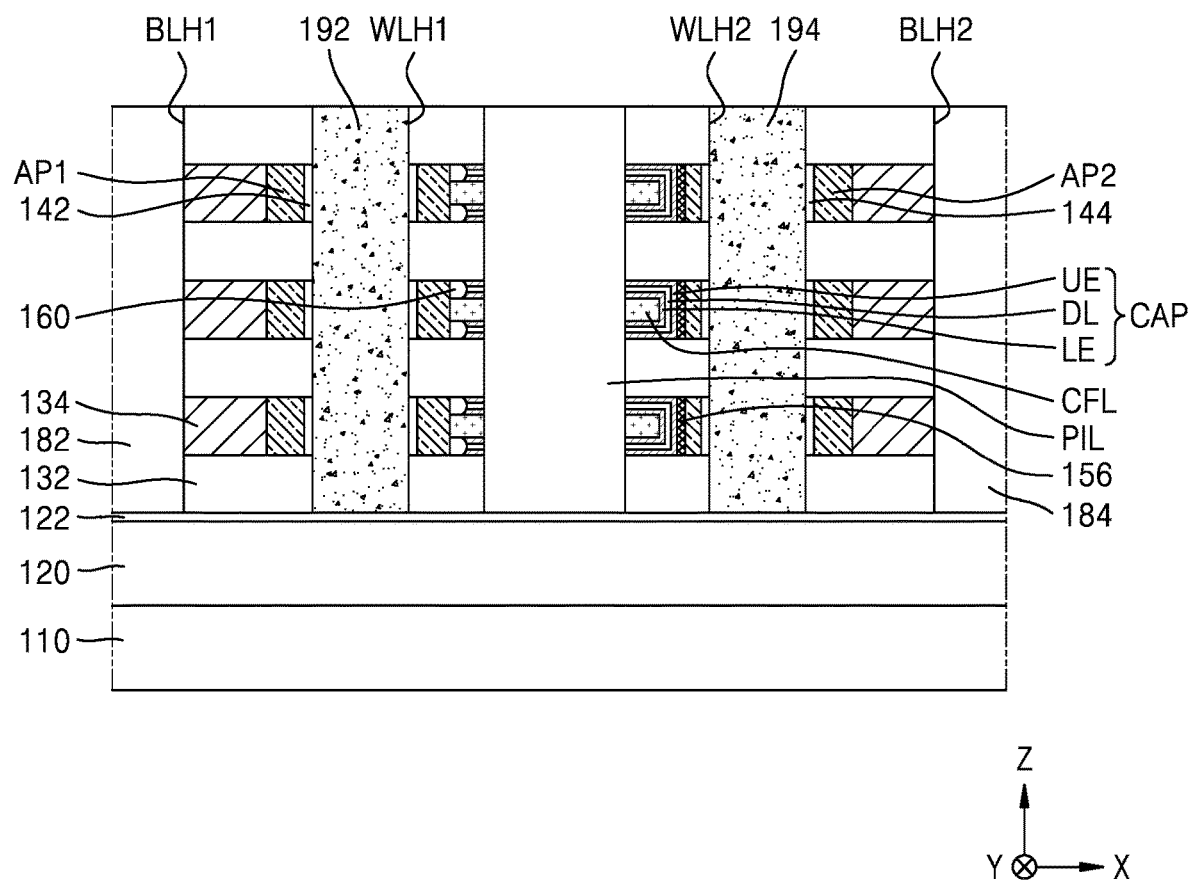
Figure 22B:
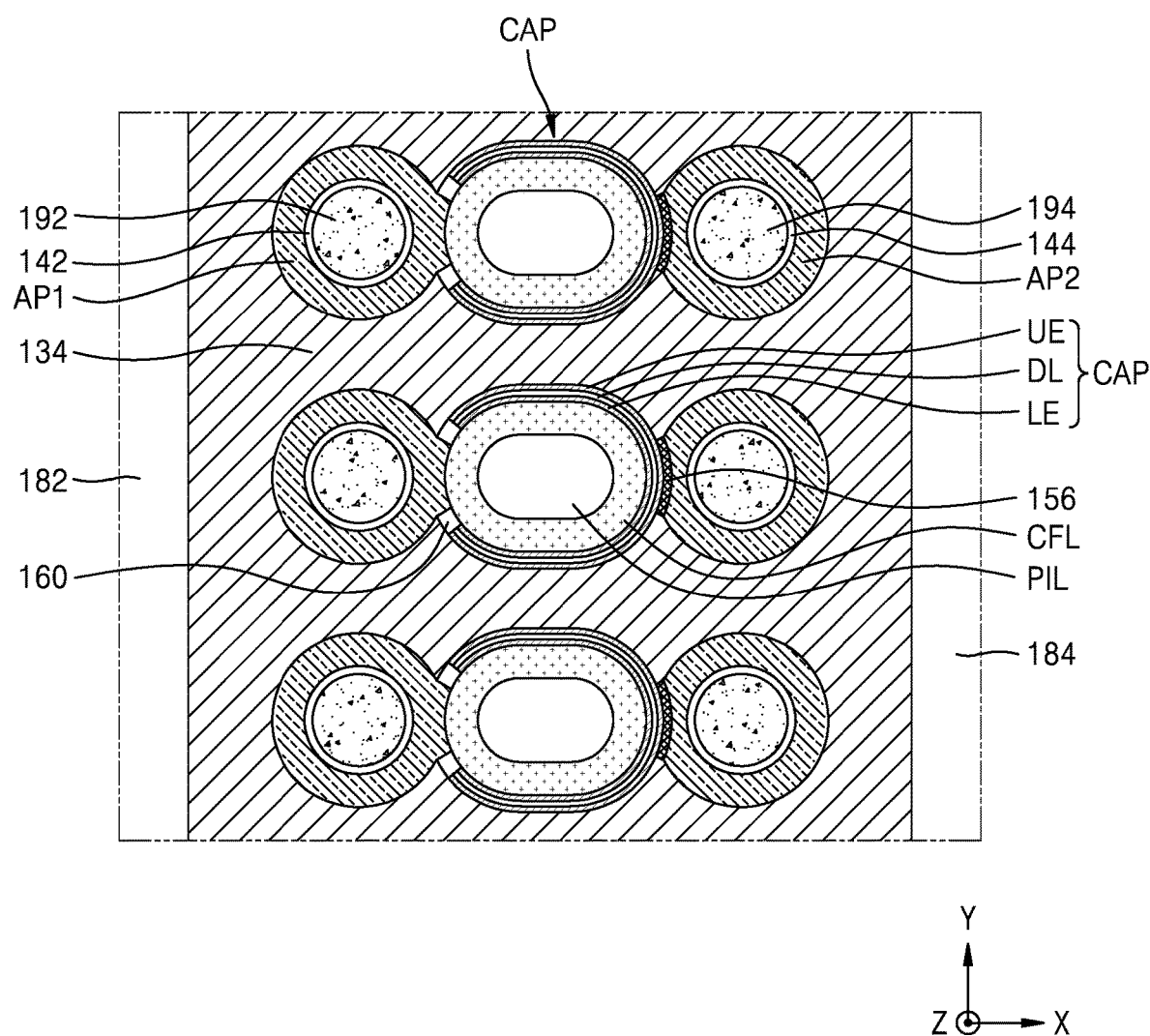

Referring to FIGS. 22A and 22B, the capacitor contact layer 156 may be formed on a surface of the upper electrode UE, which is exposed at the inner wall of the second expansion space EXS2. For example, the capacitor contact layer 156 may be formed by forming a metal layer (not shown) on the exposed surface of the upper electrode UE and performing a thermal treatment process.

Next, the second semiconductor pattern AP2 may be formed on the inner wall of the second expansion space EXS2. In example embodiments, the second semiconductor pattern AP2 may be formed by a CVD process, a PECVD process, or an ALD process.

Next, the second gate insulating layer 144 may be formed on the inner wall of the second semiconductor pattern AP2. The second gate insulating layer 144 may be formed by at least one of a thermal oxidation process, a CVD process, a PECVD process, and an ALD process. In some embodiments, the second gate insulating layer 144 may cover only the inner wall of the second semiconductor pattern AP2. In some other embodiments, the second gate insulating layer 144 may cover both the inner wall of the second semiconductor pattern AP2 and the inner wall of the mold insulating layer 132.

Next, a sixth sacrificial layer 194 may be formed to fill the second word line hole WLH2. In some embodiments, the sixth sacrificial layer 194 may be formed of silicon nitride.

Figure 23A:
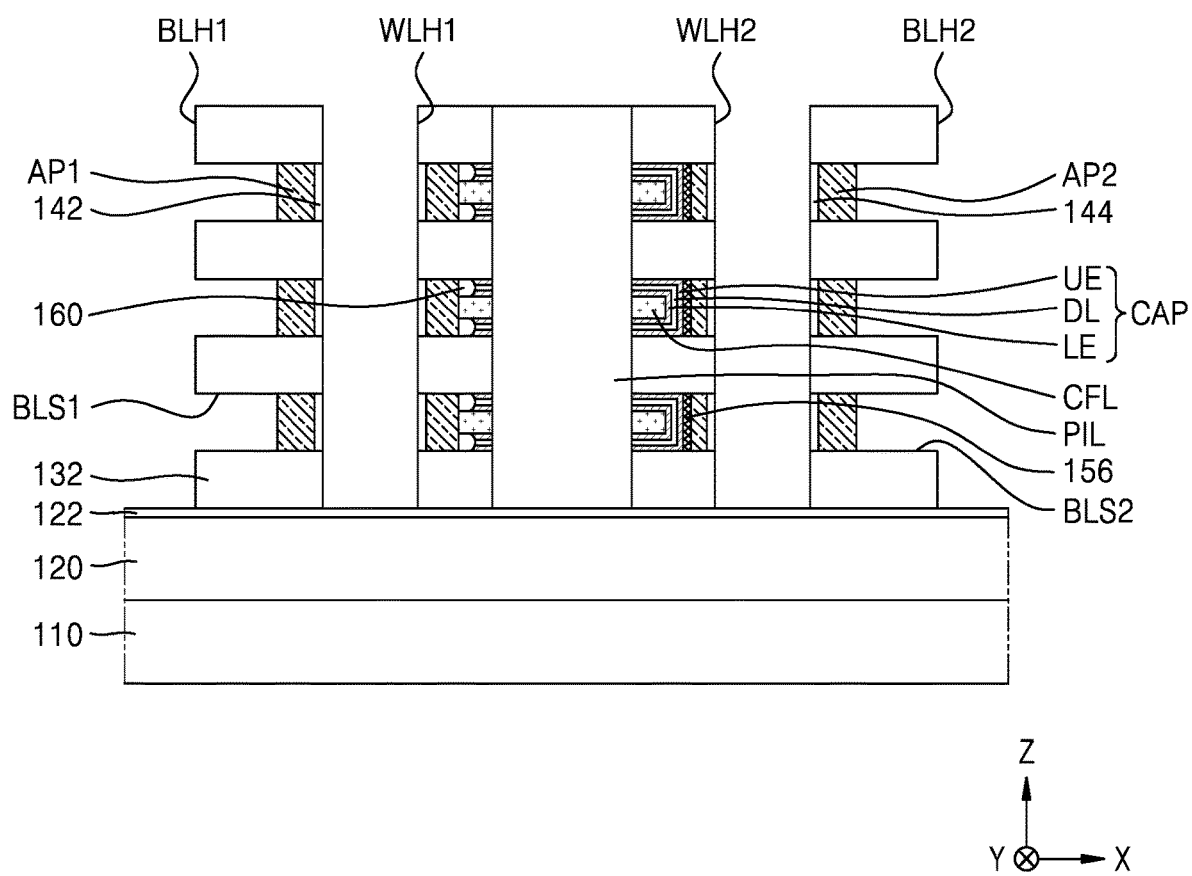
Figure 23B:
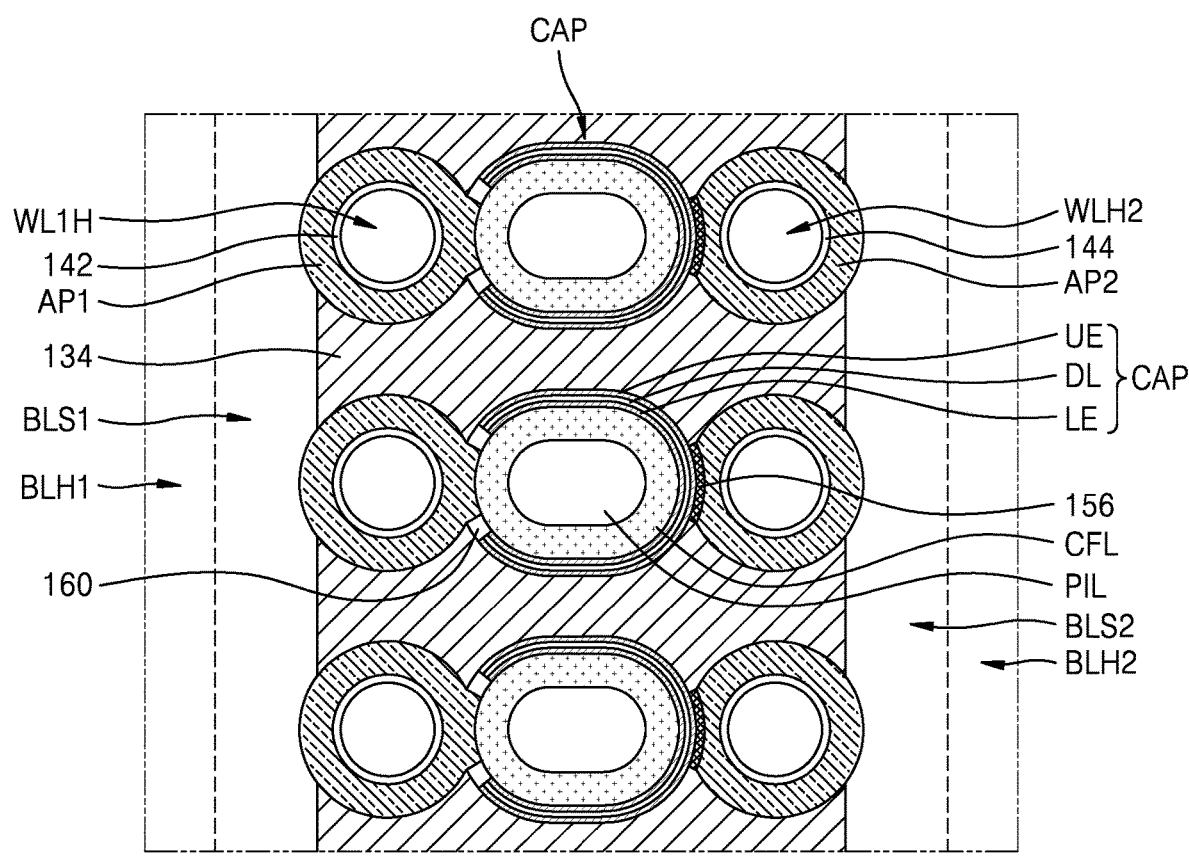

Referring to FIGS. 23A and 23B, the first sacrificial layer 182, the second sacrificial layer 184, the fifth sacrificial layer 192, and the sixth sacrificial layer 194 may be removed, and the respective inner walls of the first and second bit line holes BLH1 and BLH2 and the first and second word line holes WLH1 and WLH2 may be exposed again.

Next, a first bit line space BLS1, which communicates with the first bit line hole BLH1, and a second bit line space BLS2, which communicates with the second bit line hole BLH2, may be formed by removing portions of the sacrificial insulating layer 134, which are exposed by the first and second bit line holes BLH1 and BLH2.

The first bit line space BLS1 and the second bit line space BLS2 may be respectively formed by removing portions of the sacrificial insulating layer 134, which are adjacent to the first and second bit line holes BLH1 and BLH2, such that a portion of the sidewall of the first semiconductor pattern AP1 and a portion of the sidewall of the second semiconductor pattern AP2 are exposed.

Figure 24B:
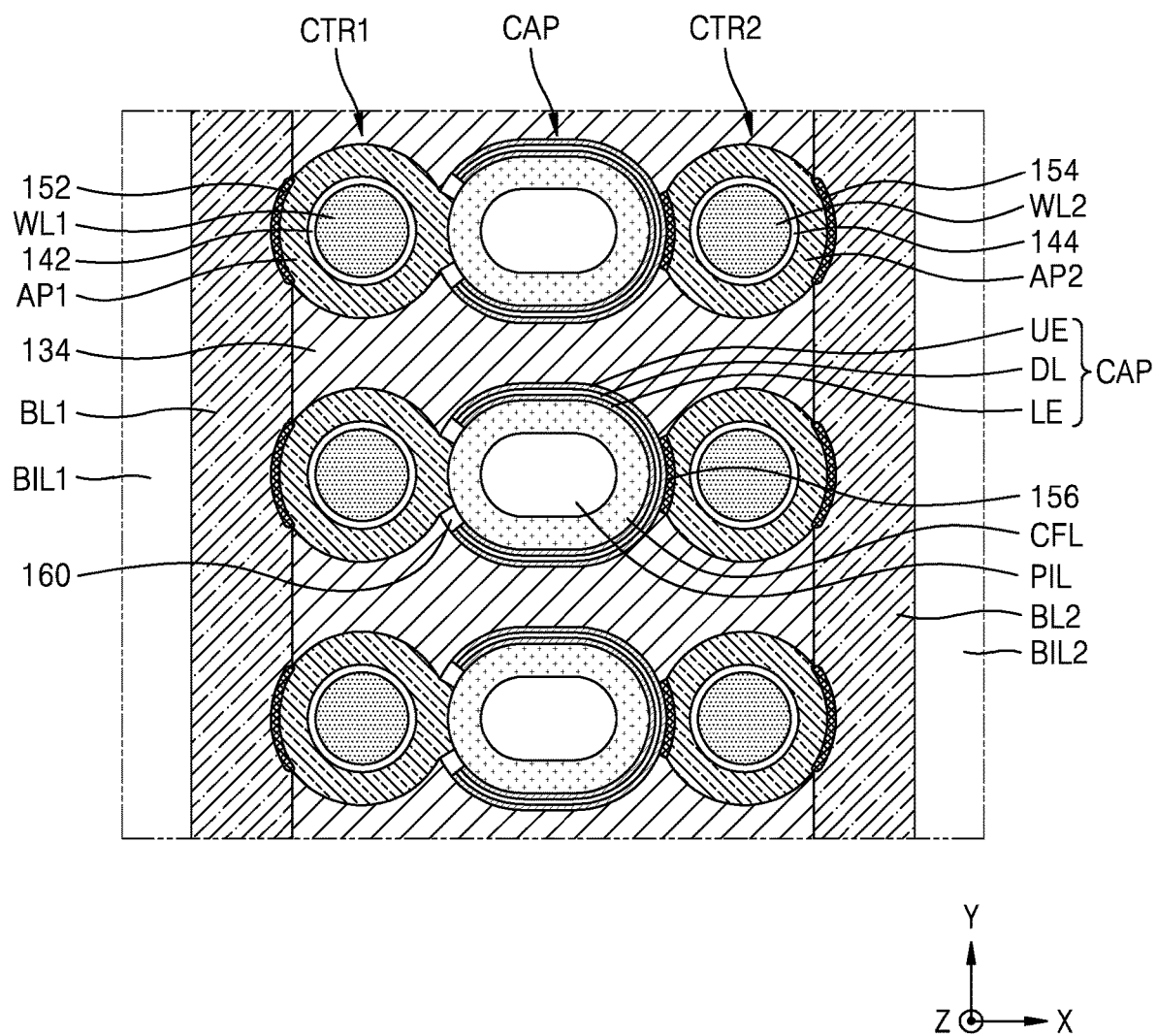

Referring to FIGS. 24A and 24B, the first contact layer 152 may be formed on a surface of the first semiconductor pattern AP1, which is exposed at an inner wall of the first bit line space BLS1, and the second contact layer 154 may be formed on a surface of the second semiconductor pattern AP2, which is exposed at an inner wall of the second bit line space BLS2. For example, the first contact layer 152 and the second contact layer 154 may be formed by respectively forming metal layers (not shown) on the exposed surfaces of the first semiconductor pattern AP1 and the second semiconductor pattern AP2 and performing a thermal treatment process.

Next, the first bit line BL1 and the second bit line BL2 may be formed by filling the insides of the first and second bit line spaces BLS1 and BLS2 with a conductive material, and the first word line WL1 and the second word line WL2 may be formed by filling the insides of the first and second word line holes WLH1 and WLH2 with a conductive material. In example embodiments, a process of forming the first and second bit lines BL1 and BL2 and a process of forming the first and second word lines WL1 and WL2 may be simultaneously performed. For example, the first and second bit lines BL1 and BL2 and first and second word lines WL1 and WL2 may be formed of the same material.

Next, the first filling insulating layer BIL1 and the second filling insulating layer BIL2 may be respectively formed in the first bit line hole BLH1 and the second bit line hole BLH2.

Referring again to FIGS. 3 and 4, the upper insulating layer 170 may be formed on the top surface of the uppermost mold insulating layer 132 to cover the first and second word lines WL1 and WL2. Next, holes (not shown) may be formed through the upper insulating layer 170 to expose a top surface of the first word line WL1 and a top surface of the second word line WL2, and the word line contacts 172 may be formed by filling the holes with a conductive material. The common word line CWL may be formed on the upper insulating layer 170 and the word line contacts 172 to extend in the first horizontal direction (X direction), by using a conductive material.

The semiconductor memory device 100 may be completed by performing the above-described processes.

In general, while a 2T-1C-type semiconductor memory device has a structure in which a cell transistor and a capacitor are arranged at different levels from each other in a vertical direction, a degree of difficulty of a process of fabricating this structure may be significantly high. For example, a process of connecting a first cell transistor to a lower electrode of a capacitor and connecting a second cell transistor to an upper electrode of the capacitor to form a structure in which the first cell transistor, the capacitor, and the second cell transistor are stacked in the vertical direction has a significantly high degree of difficulty, and thus, faults are likely to occur in the fabrication process. In addition, because a line length from a peripheral circuit, such as a bit line sense amplifier, to a first bit line is different from a line length from the peripheral circuit to a second bit line, signal delays may be different between signals transferred via the first and second bit lines, which may need to be addressed an additional measure.

However, according to example embodiments, the first cell transistor CTR1, the cell capacitor CAP, and the second cell transistor CTR2 may be sequentially arranged in the stated order in the first horizontal direction (X direction), the lower electrode LE may be connected to the first cell transistor CTR1 by exposing one end of the cell capacitor CAP, and the upper electrode UE may be connected to the second cell transistor CTR2 by exposing the other end of the cell capacitor CAP. Accordingly, a degree of difficulty of a fabrication process for forming a 2T-1C structure may be reduced. In addition, as the first bit line BL1 and the second bit line BL2 are arranged at the same vertical level, a line length from a peripheral circuit to the first bit line BL1 may be equal to a line length from the peripheral circuit to the second bit line BL2, and thus, the occurrence of a signal delay issue may be prevented between signals transferred via the first and second bit lines.

While the inventive concept has been particularly shown and described with reference to embodiments thereof, it will be understood that various changes in form and details may be made therein without departing from the spirit and scope of the following claims.

What is claimed is:

1. A semiconductor memory device comprising:
a first word line extending in a vertical direction over a substrate;
a second word line arranged over the substrate to be spaced apart from the first word line in a first horizontal direction, the second word line extending in the vertical direction;
a first semiconductor pattern having a ring-shaped horizontal cross-section that surrounds the first word line, the first semiconductor pattern constituting a portion of a first cell transistor;
a second semiconductor pattern having a ring-shaped horizontal cross-section that surrounds the second word line, the second semiconductor pattern constituting a portion of a second cell transistor;
a cell capacitor between the first semiconductor pattern and the second semiconductor pattern, the cell capacitor comprising a first electrode, a second electrode surrounding the first electrode, and a capacitor dielectric film between the first electrode and the second electrode;
a conductive filling layer contacting the first semiconductor pattern and the first electrode;
a capacitor contact layer contacting the second semiconductor pattern and the second electrode;

a first bit line arranged opposite the cell capacitor with respect to the first semiconductor pattern and extending in a second horizontal direction that is perpendicular to the first horizontal direction; and a second bit line arranged opposite the cell capacitor with respect to the second semiconductor pattern and extending in the second horizontal direction.

2. The semiconductor memory device of claim 1, further comprising:
a common word line extending in the first horizontal direction at a higher vertical level than the first word line and the second word line, the common word line being electrically connected to the first word line and the second word line.

3. The semiconductor memory device of claim 1, wherein the first semiconductor pattern, the cell capacitor, and the second semiconductor pattern are sequentially arranged in the stated order in the first horizontal direction,
the first semiconductor pattern is electrically connected to the first electrode, and the second semiconductor pattern is electrically connected to the second electrode.

4. The semiconductor memory device of claim 1, further comprising
an insulating pillar extending in the vertical direction over the substrate and surrounded by the cell capacitor,
wherein the conductive filling layer surrounds a sidewall of the insulating pillar and having a ring-shaped horizontal cross-section, and
wherein a portion of a top surface, a portion of a sidewall, and a portion of a bottom surface of the conductive filling layer contact the cell capacitor.

5. The semiconductor memory device of claim 4, wherein a portion of an outer sidewall of the conductive filling layer contacts the first semiconductor pattern, and the first semiconductor pattern is electrically connected to the first electrode via the conductive filling layer.

6. The semiconductor memory device of claim 4, further comprising:
an isolation insulating layer arranged on a portion of the top surface and a portion of the bottom surface of the conductive filling layer, the isolation insulating layer being arranged between the first semiconductor pattern and the cell capacitor.

7. The semiconductor memory device of claim 1, wherein the first electrode has a vertical cross-section having a 90 degree-rotated U shape, and
the second electrode has a vertical cross-section having a 90 degree-rotated U shape.

8. The semiconductor memory device of claim 1, wherein the first semiconductor pattern comprises polysilicon, and
the semiconductor memory device further comprises
a contact layer between the first bit line and a sidewall of the first semiconductor pattern.

9. The semiconductor memory device of claim 1, wherein the first semiconductor pattern comprises an oxide semiconductor material, and
the first semiconductor pattern contacts the first bit line.

10. A semiconductor memory device comprising:
a first word line extending in a vertical direction over a substrate;
a second word line arranged over the substrate to be spaced apart from the first word line in a first horizontal direction, the second word line extending in the vertical direction;
a first semiconductor pattern having a ring-shaped horizontal cross-section that surrounds the first word line, the first semiconductor pattern constituting a portion of a first cell transistor;
a second semiconductor pattern having a ring-shaped horizontal cross-section that surrounds the second word line, the second semiconductor pattern constituting a portion of a second cell transistor;
an insulating pillar arranged between the first semiconductor pattern and the second semiconductor pattern and extending in the vertical direction;
a cell capacitor surrounding a sidewall of the insulating pillar and arranged between the first semiconductor pattern and the second semiconductor pattern, the cell capacitor comprising a first electrode electrically connected to the first semiconductor pattern, a second electrode surrounding the first electrode, and a capacitor dielectric film between the first electrode and the second electrode;
a first bit line arranged opposite the cell capacitor with respect to the first semiconductor pattern and extending in a second horizontal direction that is perpendicular to the first horizontal direction; and
a second bit line arranged opposite the cell capacitor with respect to the second semiconductor pattern and extending in the second horizontal direction.

11. The semiconductor memory device of claim 10, further comprising:
a conductive filling layer arranged on the sidewall of the insulating pillar and surrounded by the first electrode, the conductive filling layer having a ring-shaped horizontal cross-section.

12. The semiconductor memory device of claim 11, wherein the first electrode does not contact the first semiconductor pattern, and the conductive filling layer contacts the first semiconductor pattern.

13. The semiconductor memory device of claim 11, wherein the second electrode is electrically connected to the second semiconductor pattern.

14. The semiconductor memory device of claim 11, further comprising:
an isolation insulating layer arranged on a top surface and a bottom surface of the conductive filling layer, the isolation insulating layer being arranged between the first semiconductor pattern and the first electrode.

15. A semiconductor memory device comprising:
a first word line extending in a vertical direction over a substrate;
a second word line arranged over the substrate to be spaced apart from the first word line in a first horizontal direction, the second word line extending in the vertical direction;
a plurality of first semiconductor patterns arranged on a sidewall of the first word line to be spaced apart from each other in the vertical direction, the plurality of first semiconductor patterns constituting respective portions of a plurality of first cell transistors;
a plurality of second semiconductor patterns arranged on a sidewall of the second word line to be spaced apart from each other in the vertical direction, the plurality of second semiconductor patterns constituting respective portions of a plurality of second cell transistors;
a plurality of conductive filling layers respectively contacting the plurality of first semiconductor patterns;
a plurality of cell capacitors respectively disposed between the plurality of first semiconductor patterns and the plurality of second semiconductor patterns, each of the plurality of cell capacitors comprising a first electrode contacting a corresponding one of the plurality of conductive filling layers, a second electrode contacting a corresponding one of the plurality of second semiconductor patterns, and a capacitor dielectric film between the first electrode and the second electrode;

a plurality of first bit lines electrically connected to the plurality of first semiconductor patterns respectively, the plurality of first bit lines spaced apart from each other in the vertical direction, the plurality of first bit lines extending in a second horizontal direction that is perpendicular to the first horizontal direction; and a plurality of second bit lines electrically connected to the plurality of second semiconductor patterns respectively, the plurality of second bit lines spaced apart from each other in the vertical direction, the plurality of second bit lines extending in the second horizontal direction.

16. The semiconductor memory device of claim 15, further comprising:

an insulating pillar surrounded by the plurality of cell capacitors and extending in the vertical direction, wherein the plurality of conductive filling layers are arranged on a sidewall of the insulating pillar and respectively surrounded by a plurality of first electrodes of the plurality of cell capacitors, and each of the plurality of conductive filling layers has a ring-shaped horizontal cross-section.

17. The semiconductor memory device of claim 16, wherein the plurality of first semiconductor patterns are electrically connected to the plurality of first electrodes of the plurality of cell capacitors via the plurality of conductive filling layers, respectively, and the plurality of second semiconductor patterns are electrically connected to a plurality of second electrodes of the plurality of cell capacitors, respectively.

18. The semiconductor memory device of claim 16, further comprising:

a common word line extending in the first horizontal direction at a higher vertical level than the first word line and the second word line, the common word line being electrically connected to the first word line and the second word line.

19. The semiconductor memory device of claim 15, further comprising:

a plurality of mold insulating layers arranged apart from each other in the vertical direction and surrounding a sidewall of the first word line and a sidewall of the second word line, wherein each of the plurality of cell capacitors is arranged between two adjacent mold insulating layers from among the plurality of mold insulating layers.

20. The semiconductor memory device of claim 15, wherein the first electrode has a vertical cross-section having a 90 degree-rotated U shape, and the second electrode has a vertical cross-section having a 90 degree-rotated U shape.

* * * * *